US009780438B2

(12) United States Patent
Kuehler et al.

(10) Patent No.: US 9,780,438 B2
(45) Date of Patent: Oct. 3, 2017

(54) DEPOSITION ANTENNA APPARATUS AND METHODS

(71) Applicant: Pulse Electronics, Inc., San Diego, CA (US)

(72) Inventors: Dan Kuehler, San Diego, CA (US); Bruce Hamilton, Escondido, CA (US); Alan Benjamin, Elfin Forest, CA (US); Petteri Annamaa, Oulunsalo (FI); Esa Kalistaja, Oulu (FI)

(73) Assignee: PULSE ELECTRONICS, INC., San Diego, CA (US)

( * ) Notice: Subject to any disclaimer, the term of this patent is extended or adjusted under 35 U.S.C. 154(b) by 834 days.

(21) Appl. No.: 13/782,993

(22) Filed: Mar. 1, 2013

(65) Prior Publication Data

US 2013/0229314 A1 Sep. 5, 2013

Related U.S. Application Data

(60) Provisional application No. 61/606,320, filed on Mar. 2, 2012, provisional application No. 61/609,868, filed (Continued)

(51) Int. Cl.

*H01Q 1/24* (2006.01)
*H01Q 1/38* (2006.01)

(Continued)

(52) U.S. Cl.

CPC ............... *H01Q 1/24* (2013.01); *H01P 11/00* (2013.01); *H01Q 1/243* (2013.01); *H01Q 1/38* (2013.01);

(Continued)

(58) Field of Classification Search

CPC ..................................................... H01Q 1/243

(Continued)

(56) References Cited

U.S. PATENT DOCUMENTS 3,614,554 A 10/1971 Shield et al.
4,253,231 A 3/1981 Nouet (Continued)

FOREIGN PATENT DOCUMENTS

CN 1262492 A 8/2000
CN 1484935 A 3/2004

(Continued)

OTHER PUBLICATIONS

Ahn, et al., Omnidirectional Printing of Flexible, Stretchable, and Spanning Silver Microelectrodes, Mar. 20, 2009, vol. 323, www.sciencernag.corn, 4 pages.

(Continued)

*Primary Examiner* — Graham Smith
(74) *Attorney, Agent, or Firm* — Gazdzinski & Associates, PC

(57) ABSTRACT

Space- and cost-efficient antenna apparatus and methods of making and using the same. In one embodiment, the antenna is formed using a deposition process, whereby a conductive fluid or other material is deposited directly on one or more interior components of a host device (e.g., cellular phone or tablet computer). The antenna can be formed in a substantially three-dimensional "loop" shape, and obviates several costly and environmentally unfriendly processing steps and materials associated with prior art antenna manufacturing approaches.

23 Claims, 17 Drawing Sheets

Related U.S. Application Data on Mar. 12, 2012, provisional application No. 61/750, 207, filed on Jan. 8, 2013.

(51) Int. Cl.
*H01P 11/00* (2006.01)
*H05K 3/32* (2006.01)
*H05K 1/16* (2006.01)
*H05K 3/12* (2006.01)

(52) U.S. Cl.
CPC ............... *H05K 1/165* (2013.01); *H05K 3/32* (2013.01); *H05K 3/1241* (2013.01); *Y10T 29/49018* (2015.01)

(58) Field of Classification Search
USPC .......................................................... 343/702
See application file for complete search history.

(56) References Cited

U.S. PATENT DOCUMENTS

| | | | |
|---|---|---|---|
| 4,547,961 A | 10/1985 | Bokil et al. | |
| 4,847,986 A | 7/1989 | Meinel | |
| 5,055,816 A | 10/1991 | Altman et al. | |
| 5,126,714 A | 6/1992 | Johnson | |
| 5,257,000 A | 10/1993 | Billings et al. | |
| 5,487,214 A | 1/1996 | Walters | |
| 5,781,091 A | 7/1998 | Krone et al. | |
| 6,165,386 A | 12/2000 | Endo et al. | |
| 6,184,833 B1 | 2/2001 | Tran | |
| 6,285,327 B1 | 9/2001 | See | |
| 6,421,013 B1 | 7/2002 | Chung | |
| 6,440,750 B1 | 8/2002 | Feygenson et al. | |
| 6,445,271 B1 | 9/2002 | Johnson | |
| 6,533,866 B1 | 3/2003 | Franz et al. | |
| 6,745,058 B2 | 6/2004 | Boulay et al. | |
| 6,962,511 B2 | 11/2005 | Gutierrez et al. | |
| 7,112,246 B2 | 9/2006 | Schucker | |
| 7,241,181 B2 | 7/2007 | Machado et al. | |
| 7,311,937 B2 | 12/2007 | Hashimoto | |
| 7,345,645 B2 | 3/2008 | Cho | |
| 7,477,194 B2 * | 1/2009 | Coleman .......... | G06K 19/07749 257/E23.064 |
| 7,480,979 B2 | 1/2009 | Moren | |
| 7,642,918 B2 | 1/2010 | Kippelen et al. | |
| 7,782,211 B2 | 8/2010 | Yamaguchi et al. | |
| 7,859,481 B2 | 12/2010 | Muraoka | |
| 8,115,684 B2 | 2/2012 | Palin | |
| 8,148,818 B2 | 4/2012 | Yamazaki et al. | |
| 8,237,248 B2 | 8/2012 | Yamazaki et al. | |
| 8,284,117 B2 | 10/2012 | Kim et al. | |
| 8,405,561 B2 | 3/2013 | Handy et al. | |
| 8,659,487 B2 * | 2/2014 | Fan ........................ | H01Q 1/364 343/700 MS |
| 8,679,573 B2 | 3/2014 | Van et al. | |
| 2001/0043135 A1 | 11/2001 | Yamada et al. | |
| 2002/0118350 A1 | 8/2002 | Cabiri et al. | |
| 2002/0121959 A1 | 9/2002 | Fontana et al. | |
| 2003/0173678 A1 | 9/2003 | Mizukoshi | |
| 2004/0144958 A1 | 7/2004 | Conaghan et al. | |
| 2004/0203173 A1 | 10/2004 | Peck et al. | |
| 2005/0266154 A1 | 12/2005 | Devos et al. | |
| 2006/0159899 A1 | 7/2006 | Edwards et al. | |
| 2006/0176139 A1 | 8/2006 | Pleskach et al. | |
| 2006/0290457 A1 | 12/2006 | Lee et al. | |
| 2007/0001796 A1 | 1/2007 | Waffenschmidt et al. | |
| 2007/0102685 A1 | 5/2007 | Kodas et al. | |
| 2007/0216510 A1 | 9/2007 | Jeong et al. | |
| 2008/0204516 A1 | 8/2008 | Kim et al. | |
| 2008/0314165 A1 | 12/2008 | Rosenberg | |
| 2009/0145640 A1 | 6/2009 | Toyoda | |
| 2009/0146658 A1 | 6/2009 | McDowell et al. | |
| 2009/0207198 A1 | 8/2009 | Muraoka | |
| 2009/0226605 A1 | 9/2009 | Chopra et al. | |
| 2009/0229108 A1 | 9/2009 | Shamblin et al. | |
| 2010/0011568 A1 | 1/2010 | Harding | |
| 2010/0127084 A1 | 5/2010 | Pavate et al. | |
| 2011/0050381 A1 | 3/2011 | Olson | |
| 2011/0096388 A1 | 4/2011 | Agrawal et al. | |
| 2011/0140978 A1 | 6/2011 | Maruyama | |
| 2011/0285492 A1 | 11/2011 | Wang et al. | |
| 2011/0304520 A1 | 12/2011 | Djordjevic et al. | |
| 2012/0038514 A1 | 2/2012 | Bang | |
| 2012/0058676 A1 | 3/2012 | Schaffer et al. | |
| 2012/0081420 A1 | 4/2012 | Yu et al. | |
| 2012/0146855 A1 | 6/2012 | Spencer et al. | |
| 2012/0235879 A1 | 9/2012 | Eder et al. | |
| 2012/0319905 A1 | 12/2012 | Fan et al. | |
| 2013/0076572 A1 | 3/2013 | Lee et al. | |
| 2013/0076573 A1 | 3/2013 | Rappoport et al. | |
| 2013/0076574 A1 | 3/2013 | Rappoport et al. | |
| 2013/0176176 A1 | 7/2013 | Vos et al. | |
| 2013/0234899 A1 | 9/2013 | Pope et al. | |

FOREIGN PATENT DOCUMENTS

| | | | |
|---|---|---|---|
| CN | 281892 | Y | 9/2006 |
| CN | 101189625 | A | 5/2008 |
| CN | 101577361 | A | 11/2009 |
| CN | 101908667 | A | 12/2010 |
| CN | 102025020 | A | 4/2011 |
| EP | 2065837 | A1 | 6/2009 |
| EP | 2418924 | A1 | 2/2012 |
| EP | 2693564 | A1 | 2/2014 |
| JP | H0210705 | A | 1/1990 |
| JP | 2013065838 | A | 4/2013 |
| KR | 20030064889 | A | 8/2003 |
| KR | 20040084747 | A | 10/2004 |
| KR | 20060133239 | A | 12/2006 |
| TW | 201030628 | A | 8/2010 |
| TW | 201043114 | A | 12/2010 |
| TW | M419240 | U | 12/2011 |
| WO | WO-02054841 | A1 | 7/2002 |

OTHER PUBLICATIONS

Amin, et al., Performance-Optimized Quadrate Bowtie RFID Antennas for Cost-Effective and EGO-Friendly Industrial Applications, Progress in Electromagnetics Research, vol. 126, 49-64, 2012, 16 pages.
Barrio, et al., Screen-Printed Silver-Ink Antennas for Frequency-Reconfigurable Architectures in L TE Phones, Electronics Letters, Nov. 6, 2014, vol. 50, No. 23, pp. 1665-1667, 2 pages.
Fil Ton, The Printed World, Briefing 3D Printing, The Economist, Feb. 12, 2011, 3 pages.
Koski, et al., Inkjet-printed passive UHF RFID tags: review and performance evaluation, Inti. Journal of Advanced Manufacturing Technology, reed Jun. 28, 2011, accepted Nov. 14, 2011, 18 pages.
Kuilla, et al., Recent Advances in Graphene Based Polymer Composites, Progress in Polymer Science 35 (2010) 1350-1375, 26 pages.
Maimaiti, Study of Inkjet printing as an Ultra-Low-Cost Antenna Prototyping Method and its Application to Conformal Wraparound Antennas for Sounding Rocket Sub-Payload, Utah State Univ., 2013, 85 pages.
Montanero J.M., et al., "Micrometer Glass Nozzles for Flow Focusing," Journal of Physics D, vol. 41, 2008, pp. 1-10.
Ortego, et al., Research article, Inkjet Printed Planar Coil Antenna Analysis for NFC Technology Applications, reed Dec. 15, 2011, accepted Jan. 9, 2012, 7 pages.
Perelaer, et al., Inkjet Printing and Alternative Sintering of Narrow Conductive Tracks on Flexible Substrates for Plastic Electronic Applications, Feb. 2010, 23 pages.
Qu, et al., The Pad Printing Technology Evaluation in Mobile Phone Antenna Manufacture, Foxconn Inti Holding Group, 2010 IEEE, 4 pages.
Sowpati, et al., Performance of Printable Antennas with Different Conductor Thickness, Progress in Electromagnetics Research Letters, vol. 13, 59-65, 2010, 7 pages.

(56) References Cited

OTHER PUBLICATIONS

Walker, et al., Reactive Silver Inks for Patterning High-Conductivity Features at Mild Temperatures, Journal of the American Chemical Society (JACS), reed Oct. 1, 2011, 3 pages.
Montanero J.M., et al., Micrometer glass nozzles for flow focusing, Jun. 2010; Abstract and pp. 1-10.

* cited by examiner

DEPOSITION ANTENNA APPARATUS AND METHODS

PRIORITY

This application claims priority to U.S. Provisional Patent Application Ser. No. 61/606,320 of the same title filed Mar. 2, 2012, U.S. Provisional Patent Application Ser. No. 61/609,868 of the same title filed Mar. 12, 2012, and U.S. Provisional Patent Application Ser. No. 61/750,207 of the same title filed Jan. 8, 2013, each of the foregoing incorporated herein by reference in its entirety.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND

1. Technology Field

The present disclosure relates generally to antenna apparatus for use in electronic devices such as wireless or portable radio devices, and more particularly in one exemplary aspect to antennas manufactured using the deposition of conductive fluids, and methods of making and utilizing the same.

2. Description of Related Technology

Antennas are commonly found in most modern radio devices, such as mobile computers, mobile phones, tablet computers, smartphones, personal digital assistants (PDAs), or other personal communication devices (PCD). Typically, these antennas comprise a planar radiating plane and a ground plane parallel thereto, which are often connected to each other by a short-circuit conductor in order to achieve the matching of the antenna. The structure is configured so that it functions as a resonator at the desired operating frequency or frequencies. Typically, these internal antennas are located internal to the device (such as within the outer plastic housing), whether free-standing, disposed on a printed circuit board (PCB) of the radio device, or on another device component, so as to permit propagation of radio frequency waves to and from the antenna(s).

Aside from the high cost of manufacturing, such prior art antennas and approaches to antenna fabrication also generally consume appreciable space within the host device. As personal electronic devices such as smartphones and tablet computers continue to shrink, greater demands are place on the antenna utilized therein both from a performance perspective and a space consumption perspective. The latter is particularly acute, since the antenna must be able to operate effectively in the desired frequency band(s), yet consume the absolute minimum space possible. With largely planar antenna solutions such as those described above, a good deal of space may be wasted, since the antenna plane must be contained entirely within the housing, and often cannot be deformed or curved, such as to accommodate the curvature of a cellular telephone exterior housing. Such housings also have internal molded features or other components attached thereto, which cause further difficulty for one trying to adapt an antenna of a particular electromagnetic configuration to the housing while using only a minimum of interior volume.

As an attempt to address some of the foregoing issues, recent advances in antenna manufacturing processes have enabled the construction of antennas directly onto the surface of a specialized material (e.g., thermoplastic material that is doped with a metal additive). The doped metal additive is activated by means of a laser in a process known as laser direct structuring (LDS), which enables the construction of antennas onto more complex 3-dimensional geometries. In various typical smartphone and other applications application, the underlying smartphone housing, and/or other components which the antenna may be disposed on inside the device, may be manufactured using this specialized material, such as for example using standard injection molding processes. A laser is then used to activate areas of the (thermoplastic) material that are to be subsequently plated. Typically an electrolytic copper bath followed by successive additive layers such as nickel or gold are then added to complete the construction of the antenna.

Although being very capable technology, LDS has also some disadvantages; specialized thermoplastics' material properties do not meet the properties of traditional polymer materials, but are typically more brittle or fragile. Another disadvantage is the total cost; specialized thermoplastics resins cost more than traditional ones, and lasering and plating processes are expensive. The capital cost of the LDS capacity also represents a significant barrier to entry into the technology.

Accordingly, there is a salient need for a wireless antenna solution for e.g., a portable radio device, that offers comparable electrical performance to prior art approaches while being manufactured at lower cost and using more flexible, manufacturing processes. Certain implementations of such solution would also ideally provide enhanced economies of space, and complex geometric rendering capabilities, and moreover would reduce capital investment costs and reduce barriers to entry.

SUMMARY

The present disclosure satisfies the foregoing needs by providing, inter alia, an improved antenna and flexible, low-cost, methods of making and using the same.

In a first aspect of the disclosure, an antenna apparatus is disclosed. In one embodiment, the apparatus is for use in a portable communications device, and includes a conductor deposited on a component of the portable device (e.g., interior housing surface).

In another embodiment, the antenna is formed using a liquid conductor deposition process, and includes adjustment of its cross-sectional shape and/or area as a function of position on structure so as to, inter alia, accommodate various geometric features or structures of the host device in which it is used. Advantageously, antenna performance is improved over prior art antennas in the same application not having such adjustments.

In a second aspect of the disclosure, a method of manufacturing an antenna apparatus is disclosed. In one embodiment, the method comprises depositing (whether by "ink jetting" or spraying or other means) a conductive fluid in a desired form, and then curing the deposited fluid using e.g., electromagnetic thermal energy flash, application of heat using other means, or other approach.

In a third aspect of the disclosure, a portable radio device is disclosed. In one embodiment, the radio device is a cellular-enabled smartphone with a deposited cellular band antenna. In another embodiment, the smartphone includes a Wi-Fi interface with a deposited antenna. In yet another embodiment, the smartphone includes a GPS receiver with deposited antenna.

In a fourth aspect of the disclosure, a method of manufacturing a portable radio device is disclosed. In one embodiment, the method includes depositing one or more antennas on a component (e.g., housing) of the device in a substantially three-dimensional configuration, the configuration being particularly adapted to the specific geometry and space requirements of that device.

In a fifth aspect of the disclosure, a method of operating an antenna apparatus is disclosed. In one embodiment, the method comprises coupling the antenna apparatus to a radio frequency transceiver, and exciting the apparatus using the transceiver In a sixth aspect of the disclosure, a method of developing an antenna apparatus is disclosed. In one embodiment, the method comprises depositing a printed antenna (e.g., a wire-like loop) of a first configuration on a substrate; and subsequently depositing modified configurations of the wire loop antenna on other substrates, and testing the wire loop antenna and other configurations to identify more desirable operational features relating to the various configurations.

In a seventh aspect of the disclosure, a method of tuning an antenna apparatus is disclosed.

In an eighth aspect of the disclosure, a method of operating a mobile device is disclosed.

In a ninth aspect of the disclosure, a manufacturing apparatus useful for producing deposition antennas or other structures is disclosed. In one embodiment, the apparatus comprises: a print head configured to emit a quantity of a flowable conductive substance for deposition onto a target component; and motion apparatus configured to move the target component relative to the print head or the print head relative to the target component, so as to permit deposition of the conductive substance onto different portions of the target component. The motion apparatus is further configured to move the print head or target component in three dimensions so as to effect deposition of the conductive substance on a three-dimension portion of the target component.

In another embodiment, the print head is moved relative to the target (or platen) so as to effectuate the aforementioned material deposition.

In a further aspect, a method of forming a conductive trace over two or more dissimilar substrates is disclosed.

In yet another aspect, a method of forming a branch point or area within a conductive trace is disclosed.

In a further aspect, a method of forming an antenna feed conduction path is disclosed.

In yet an additional aspect, a method of mounting an electronic component is disclosed.

In another aspect of the disclosure, methods for forming a conductor trace interface (e.g., antenna feed point) are disclosed.

In another aspect, methods of depositing a conductive trace across a heterogeneous substrate material interface are disclosed.

In a further aspect, methods surface mounting an electronic component onto a substrate are disclosed.

In another aspect, a conductive trace (e.g., antenna) disposed on a substrate edge is disclosed.

In yet another aspect, methods for curing a substrate trace (e.g., a surface or edge trace) coincident with processing of the substrate are disclosed.

Further features of the present disclosure, its nature and various advantages will be more apparent from the accompanying drawings and the following detailed description.

Figure 1:
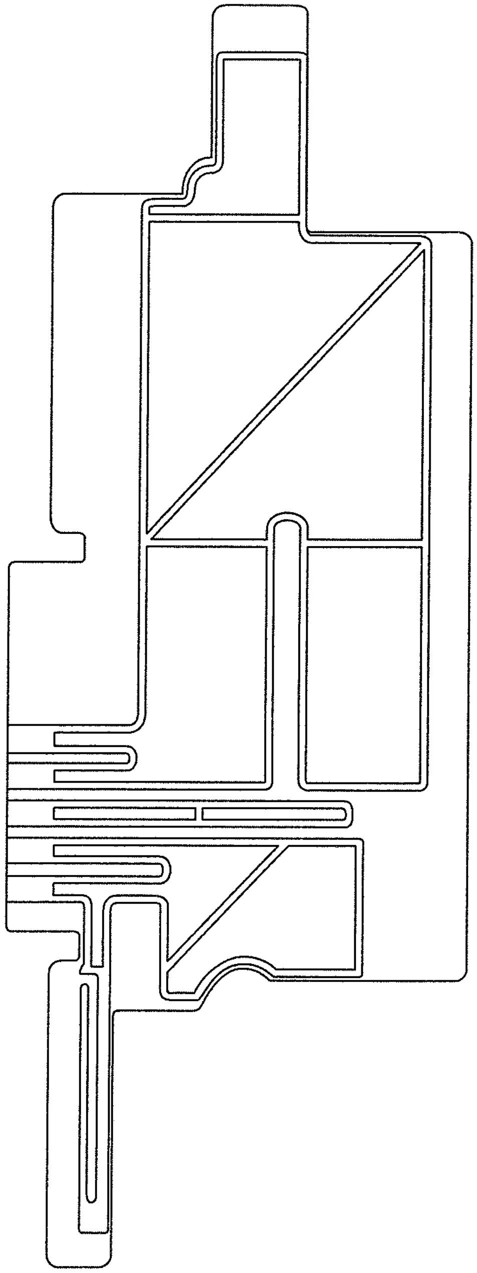
FIG. 1 is a top plan view of a first embodiment of a deposition antenna according to the disclosure, shown deposited on a flat (planar) substrate.

The features, objectives, and advantages of the disclosure will become more apparent from the detailed description set forth below when taken in conjunction with the drawings, wherein:

All of the above listed Figures are ©Copyright 2012 Pulse Electronics, Inc. All rights reserved.

DETAILED DESCRIPTION OF THE PREFERRED EMBODIMENT

Reference is now made to the drawings wherein like numerals refer to like parts throughout.

As used herein, the terms "antenna," "antenna system," "antenna assembly", and "multi-band antenna" refer without limitation to any system that incorporates a single element, multiple elements, or one or more arrays of elements that receive/transmit and/or propagate one or more frequency bands of electromagnetic radiation. The radiation may be of numerous types, e.g., microwave, millimeter wave, radio frequency, digital modulated, analog, analog/digital encoded, digitally encoded millimeter wave energy, or the like. The energy may be transmitted from location to another location, using, or more repeater links, and one or more locations may be mobile, stationary, or fixed to a location on earth such as a base station.

As used herein, the terms "board" and "substrate" refer generally and without limitation to any substantially planar or curved surface or component upon which other components can be disposed. For example, a substrate may comprise a single or multi-layered printed circuit board (e.g., FR4), a semi-conductive die or wafer, or even a surface of a housing or other device component, and may be substantially rigid or alternatively at least somewhat flexible.

As used herein, the terms "cure" and "curing" refer without limitation to a process whereby a flowable material is exposed to an agent (whether electromagnetic energy such as infrared, laser, or microwave), heat, or a chemical substance which causes a desirable mechanical or other property to occur within the flowable material. Typically curing improves or imparts one or more desired properties, such as e.g., the electrical conductivity of the material and adhesion to the substrate.

As used herein, the term "flowable" refers without limitation to liquids, gels, pastes, ink formulations, solutions, colloidal suspensions, or other physical forms of substances which have the ability to flow in some manner, whether under force of gravity or other applied force.

The terms "frequency range", "frequency band", and "frequency domain" refer without limitation to any frequency range for communicating signals. Such signals may be communicated pursuant to one or more standards or wireless air interfaces.

As used herein, the terms "portable device", "mobile computing device", "client device", "portable computing device", and "end user device" include, but are not limited to, personal computers (PCs) and minicomputers, whether desktop, laptop, or otherwise, set-top boxes, personal digital assistants (PDAs), handheld computers, personal communicators, tablet computers, portable navigation aids, J2ME equipped devices, cellular telephones, smartphones, personal integrated communication or entertainment devices, or literally any other device capable of interchanging data with a network or another device.

Furthermore, as used herein, the terms "radiator," "radiating plane," and "radiating element" refer without limitation to an element that can function as part of a system that receives and/or transmits radio-frequency electromagnetic radiation; e.g., an antenna.

The terms "RF feed," "feed," "feed conductor," and "feed network" refer without limitation to any energy conductor and coupling element(s) that can transfer energy, transform impedance, enhance performance characteristics, and conform impedance properties between an incoming/outgoing RF energy signals to that of one or more connective elements, such as for example a radiator.

As used herein, the terms "top", "bottom", "side", "up", "down", "left", "right", and the like merely connote a relative position or geometry of one component to another, and in no way connote an absolute frame of reference or any required orientation. For example, a "top" portion of a component may actually reside below a "bottom" portion when the component is mounted to another device (e.g., to the underside of a PCB).

As used herein, the term "wireless" means any wireless signal, data, communication, or other interface including without limitation Wi-Fi, Bluetooth, 3G (e.g., 3GPP, 3GPP2, and UMTS), HSDPA/HSUPA, TDMA, CDMA (e.g., IS-95A, WCDMA, etc.), FHSS, DSSS, GSM, PAN/802.15, WiMAX (802.16), 802.20, nanowband/FDMA, OFDM, PCS/DCS, Long Term Evolution (LTE) or LTE-Advanced (LTE-A), analog cellular, CDPD, satellite systems such as GPS, millimeter wave or microwave systems, optical, acoustic, and infrared (i.e., IrDA).

Overview

The present disclosure provides, inter alia, improved extremely space- and cost-efficient antenna apparatus and methods for making the same. In one exemplary embodiment, the antenna apparatus is formed onto a substrate via a deposition process that uses a flowable conductive liquid. The conductive liquid is deposited onto the substrate in a desired thickness and according to the pattern, so as to form a radiating/receiving antenna structure directly on the substrate. The deposited conductive material is then cured (using e.g., electromagnetic radiation) so as to render the conductive fluid mechanically stable, notably without any subsequent process steps such as plating.

The use of a wire loop (versus e.g., a planar or "area-fill" radiator) in the exemplary embodiment greatly reduces the material cost associated with the antenna of the present disclosure, and also adds significant flexibility in terms of the placement of the antenna within a host device.

The exemplary implementation of the process advantageously, inter alia (i) uses low-cost copper, silver, or other metallic-based fluids; (ii) requires no special substrate polymers or other materials; (iii) can be applied to even complex three-dimensional surfaces with relative ease; and (iv) can be performed much more rapidly (and with instantaneous re-programmability) as compared to prior art approaches.

The foregoing features also permit the displacement (if desired) of manufacturing operations from a dedicated manufacturing facility to an existing component manufacturing facility; e.g., the process can be readily integrated into the manufacture of the housing of a portable device in which the antenna will be used, thereby reducing manufacturing cost and overhead, and allowing individual component manufacturers to readily make adjustments to the antenna configuration or process on-site.

Moreover, the present disclosure advantageously require comparatively minimal capital investment, greatly reduce barriers to entry, and can be implemented with much less latency than prior art approaches such as LDS.

Detailed Description Of Exemplary Embodiments

Detailed descriptions of the various embodiments and variants of the apparatus and methods of the disclosure are now provided. While primarily discussed in the context of wireless mobile devices, the various apparatus and methodologies discussed herein are not so limited. In fact, many of the apparatus and methodologies described herein are useful in any number of complex antennas, whether associated with mobile or fixed devices that can benefit from the antenna methodologies and apparatus described herein.

Exemplary Antenna Apparatus

Figure 2:
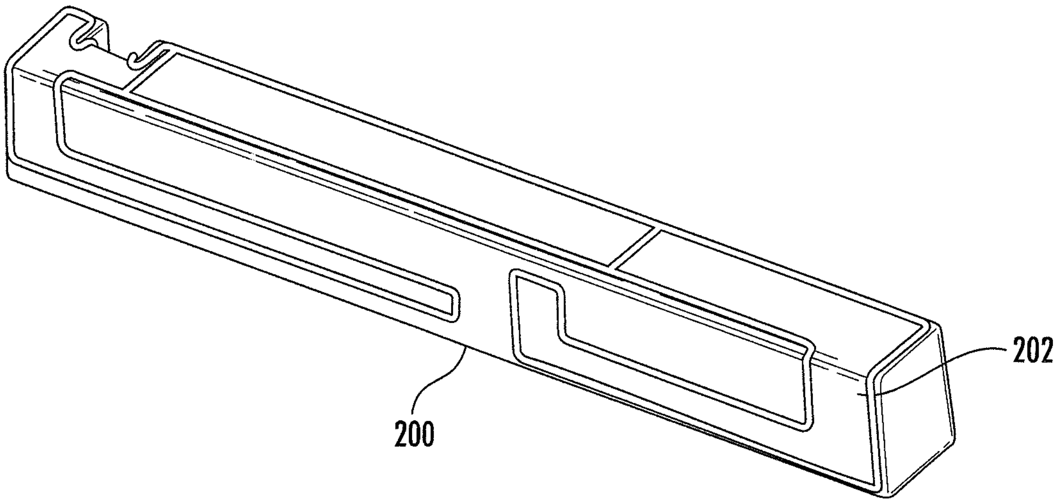
FIG. 2 is a perspective view of a second embodiment of a deposition antenna according to the disclosure, shown deposited on a three-dimensional substrate.
Figure 3:
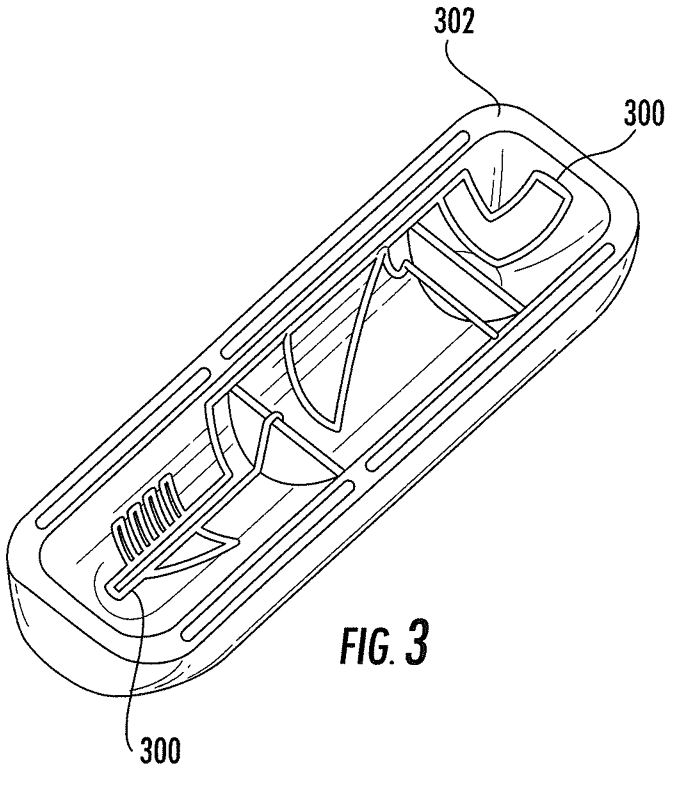
FIG. 3 is a perspective view of a third embodiment of a deposition antenna according to the disclosure, shown deposited on an exemplary three-dimensional surface of portable "candy bar" style radio device.

Referring now to FIGS. 1-3, exemplary embodiments of the antenna apparatus of the disclosure are described in detail.

FIG. 1 illustrates an exemplary printed antenna in accordance with one embodiment of the present disclosure. The printed antenna illustrated is composed of a "wire frame" or loop construction that is disposed onto an underlying substrate (in this example, a flat or planar substrate such as FR4 or ABS polymer) using e.g.: (i) a pneumatic print head; or (ii) a piezoelectric print head. Pneumatic valves are used for dispensing fluids in the exemplary embodiment because they have a fast cycle time and work reliably. In a typical configuration, these valves are powered by timed air pulses that open seals or gates which permit the flowable material to flow. Return springs close the seals.

Piezoelectric print heads use an "ink-filled" chamber in combination with a piezoelectric material and a nozzle. These print heads use an applied voltage which causes the piezoelectric material to change shape thereby generating a pressure pulse in the fluid chamber. The resultant pressure pulse forces a droplet of fluid from the nozzle where it is deposited onto the substrate.

The use of the aforementioned techniques advantageously enables the construction of printed antennas with appreciable thickness (vertical height); e.g., up to 200 micrometers in height.

The printed antenna is constructed from any one (or more) of a number of conductive inks such as copper or silver-based inks (see Exhibit A hereto for exemplary instances of flowable materials that may be used with the disclosure). Herein lies one salient advantage of the printed antenna apparatus illustrated in FIG. 1 over prior techniques such as LDS; i.e., the conductive fluid cost (whether copper-based, silver-based, or other) is appreciably lower than comparable LDS fluids.

Moreover, the selected fluids (and subsequent curing process) permit use of a broader range of substrate materials (as compared to the LDS technology), thereby further reducing overall host device cost in that no specialized plastics or methods of treating/processing them are required. This advantageously allows the use of literally any substrate within the host device, thereby avoiding having to implement specialized materials and/or additives as part of the host device design process (i.e., engineers can design the host device with literally any material which meets the other needs of the application, and the conductive material described herein will be compatible with it.). The substrate substance(s) can be beneficially a common plastic or other material including for example and without limitation, polycarbonate, ABS (acrylonitrile butadiene styrene), Glass-reinforced polycarbonate, glass, ceramic, polyimide (aka Kapton®), PEN (polyethylene naphthalate), PET (polyethylene terephthalate), or FR-4.

FIG. 2 is a perspective view of a second embodiment of a deposition antenna 200 according to the disclosure, shown deposited on a three-dimensional substrate (in this case, a rectangular block of substrate material 202 such as FR4. This Figure illustrates the enhanced three-dimensional capability of the deposition process of the current disclosure, in that the antenna wire trace maintains a substantially uniform thickness (height) and width even when traversing corners or edges of the substrate. As discussed in greater detail below, the substrate is in one embodiment moved relative to the print or jetting head so as to cause deposition of the conductive material onto the different surfaces of the substrate 202 in substantially uniform width and thickness.

FIG. 3 is a perspective view of a third embodiment of a deposition antenna 300 according to the disclosure, shown deposited on an exemplary three-dimensional surface (housing interior 302) of portable "candy bar" style cellular phone.

It is also recognized that the use of a printed loop construction disclosed herein, such as that shown in FIGS. 1-3, saves both time and materials versus prior art "area-fill" configurations. Specifically, by reducing the radiating/receiving element of the antenna to a wire frame or loop conductor equivalent, significant material cost is avoided (in that the central portion of the loop need not be filled with the conductive fluid or other material), and greatly enhanced application flexibility is provided (in that whereas a prior art conductive plane or area-fill antenna necessarily must utilize the interior or filled region thereof for operation, thereby precluding placement of any other host device or antenna components in such regions, the present disclosure is not so limited, and components can literally be placed on the interior space formed by the antenna loop or frame(s)).

It will also be noted that the exemplary embodiments of the "wire" or "loop" antenna described herein leverage what is colloquially referred to as the "waveguide property", wherein the electrical conductivity of the loop is not significantly affected even when extremes of cross-section are utilized. Specifically, it has been found that conductors formed of the exemplary conductive fluids described herein are substantially insensitive to variations in the cross-sectional profile of the conductor, including shape, and/or ratio of the height of the conductor (relative to the substrate) to the width. Accordingly, the cross-section of the conductor can, inter alia, (i) be varied from application to application; and/or (ii) be varied intra-application, such as where a given conductor of an antenna varies its height, width, and/or cross-sectional area or shape as a function of position on the wire loop. This latter property is also used in certain embodiments of the present disclosure, wherein the conductor cross-sectional shape or other parameters are varied in different portions of the loop so as to better accommodate features of the housing or other components of the host device. For example, in one variant, the "wire loop" of the antenna varies between a substantially rectangular configuration of e.g., H=2W (where H=height and W=width) where the antenna must traverse a narrow vertical opening, to a substantially flat or planar configuration of e.g., W=10 W in another region of the loop (where the antenna must traverse under a structure). Myriad such combinations of different geometries and shapes can be utilized consistent with the disclosure as will be appreciated by those of ordinary skill given the present disclosure.

It will also be appreciated that the variation in the height and/or width profile (cross-section) of the deposited antenna trace can be selectively controlled to control electromagnetic propagation or other properties within the trace itself, e.g., create desired reflection or eliminate undesired reflection.

A variety of three-dimensional configurations are readily achievable using the methods of the present disclosure, owing to both (i) the flexibility of the deposition process and fluids (i.e., materials can readily be deposited on more intricate three-dimensional surfaces of the host device housing, even over ridges or other such structures (see e.g., FIGS. 2 and 3 herein); and (ii) the ability of the width and thickness of the wire "loop" conductor to be varied as needed without affecting electrical performance, (or to intentionally affect or "shape" electrical performance).

Moreover, through use of a reprogrammable deposition technology (such as e.g., ink jet printing), the number and variety of geometries of the wire loop(s) of the antenna that can be achieved is nearly limitless. This allows for, inter alia, rapid "on the fly" changes from one production run to another (e.g., when switching from one smartphone configuration or model to another), but also intra-process (such as during prototyping, where several different variants of a generally similar antenna configuration are made and the resulting devices subsequently tested for electrical/antenna performance.

Advantageously, the exemplary embodiments of the deposition antenna of the present disclosure require no plating process of any kind, thereby both obviating the cost and time associated with such processes In another embodiment, a layer (which may be masked or not as desired) of an adherent or other material configured to promote adhesion of the conductive fluid is applied to the surface of the substrate before deposition of the conductive material. The substrate (contrast: conductive material after deposition) may alternatively (or concurrently) be cured with heat, laser energy, or otherwise treated to better accept the conductive fluid and promote adhesion between the two materials (see discussion of FIG. 5*a* below).

It will also be appreciated that composite or hybrid/heterogeneous structures may be created using the methodologies described herein. For example, in one such embodiment, two differing conductive flowable materials are used in conjunction with one another as a mixture (i.e., a "composite" or multi-component ink) mixed before deposition and applied in one printing operation.

In another embodiment, the two (or more) heterogeneous inks or materials can be applied in layers, such as by (i) applying the first layer; (ii) curing the first layer; (iii) applying the second layer at least partially atop the first; (iv) curing the second layer; and so forth. The two (or more) materials may also be applied in a juxtaposed or "side-by-side" fashion, whether in contact with one another or not, and then commonly cured.

It is also contemplated that certain materials may be amenable to common curing even when layered (i.e., apply first layer, apply second layer, and then cure both simultaneously).

Figure 3A:
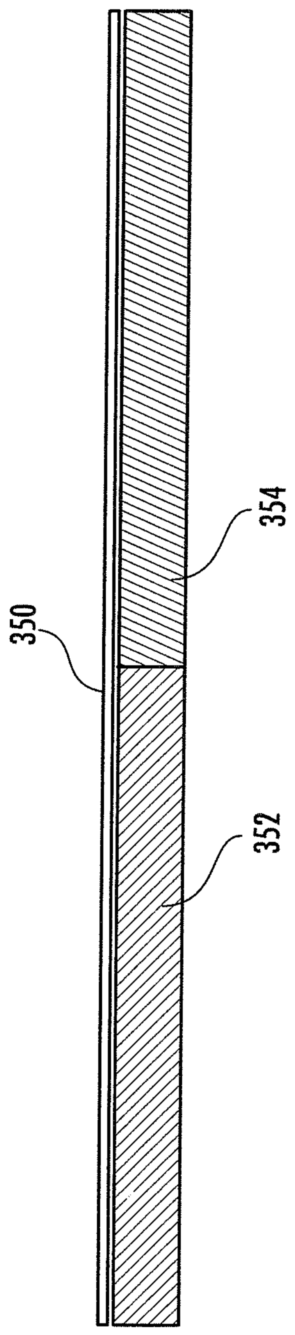
FIG. 3*a* is a cross-sectional view of an exemplary embodiment of the deposition trace (e.g., antenna) of the disclosure, shown traversing a substrate material interface.

It will also be appreciated that the exemplary deposition techniques described herein may be readily used with different substrate materials in combination. Specifically, in one aspect, the disclosure contemplates the use of different substrate materials within a common application, such that the deposition antenna conductor trace 350 traverses the two materials, such as by being printed across a boundary or interface where the two materials meet (see the exemplary configuration of FIG. 3*a* herein). In one such variant, the conductor print material (e.g., ink) is chosen so as to be compatible (from an adhesion, mechanical, etc. standpoint) with both/all substrate materials that will be encountered during the trace printing process. As previously discussed, one salient advantage of the techniques described in the present disclosure is their ability to be used on/with a wide variety of substrate materials. Hence, where a given application (e.g., smartphone) has a number of such materials in proximity to one another, and the placement of the antenna "loop" is desired to traverse two or more of these materials 352, 354, the proper choice of printing medium (e.g., ink) can allow for placement of the conductive loop in such regions, without the need for having to switch out inks during the printing process. Notably, prior art processes such as LDS require significant effort (and cost) to achieve such transitions, since different processes must typically be utilized for the different substrate materials, making use of such approaches cost-prohibitive and effectively untenable.

Notwithstanding, the present disclosure also contemplates (and facilitates) use of a transition or "switch" of conductive material at boundaries between different substrate materials, such transition being performed for any number of reasons. For instance, it may be the case that no single suitable ink or other conductive medium can be found for each of the multiple substrates encountered. Alternatively, it may be desired to vary the physical/electrical properties of the conductive trace(s) on the different substrate materials, even where one suitable conductive material can be found. As another possibility, the curing processes required for a given conductive medium may be compatible with one substrate material, but not another.

Figure 3B:
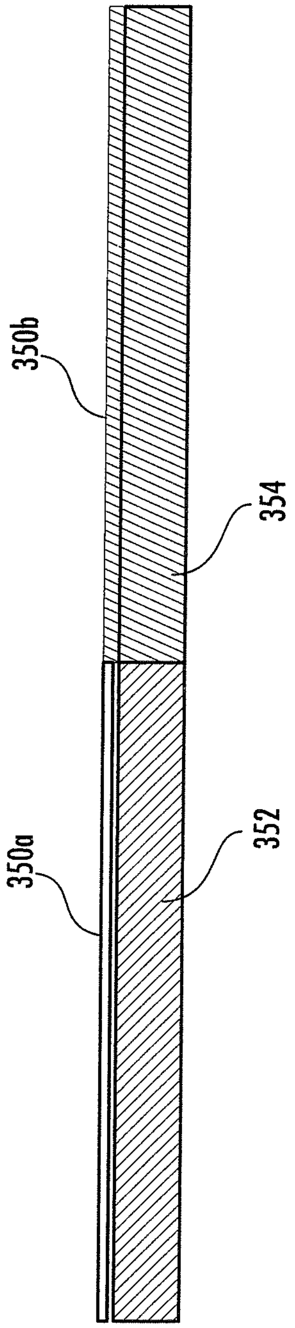
FIG. 3*b* is a cross-sectional view of another embodiment of the deposition trace (e.g., antenna) of the disclosure, shown traversing a substrate material interface and utilizing two different deposition materials.

Hence, in another variant of the disclosure, a "switch" of inks is used; i.e., at the boundary of the different substrate materials 352, 354, such as shown in FIG. 3*b* herein. This transition is accomplished in one implementation by literally stopping the print head printing the first ink 350*a* at or close to the boundary of the materials, and then continuing the process with a different ink 350*b* where the stop occurs, such that the second (continuation) trace physically butts up against or overlaps the end of the first trace, so as to maintain electrical continuity/conductivity. It will be appreciated that such a conductive interface may increase electromagnetic energy reflections or other artifacts within the conductor at the boundary, and hence these may need to be considered in the selection of the two conductive materials, geometry of the interface, etc. For instance, it may be desirable to adjust the geometry of the interface relative to the trace on either side of the transition region (e.g., make it wider, narrower, taller, shorter, angled, rounded/bulged, etc.) so as to achieve the desired electrical and/or physical characteristics for the interface.

Figure 3C:
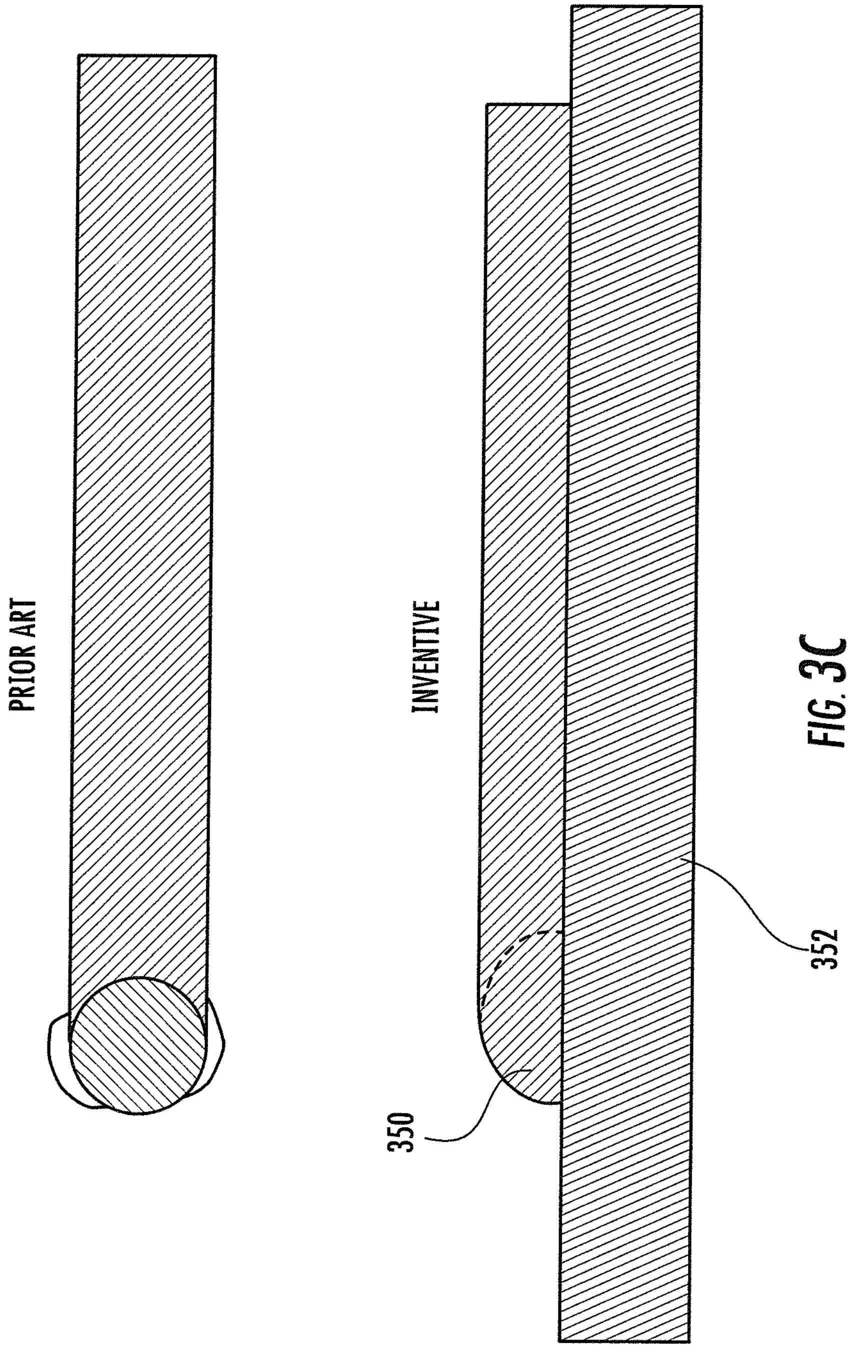
FIG. 3*c* is a cross-sectional view of an exemplary embodiment of the deposition trace (e.g., antenna) of the disclosure, shown at a branch point thereof, and in comparison to a typical prior art branch technique.

It is also recognized by those of ordinary skill that the deposition techniques of the present disclosure provide the ability to readily "branch" a given conductive trace in any manner and in any direction. In that the exemplary printed trace disclosed herein in some regards approximates a wire loop, the prior art use of an actual wire conductor (e.g., extruded or formed metal) is not amenable to branching (such as forming a "T" shape at a given point along the conductor) without for example brazing, soldering, welding, or otherwise joining two distinct wire segments. This prior art approach is therefore necessarily clumsy and cost inefficient, since additional materials and process steps are required. In contrast, the exemplary deposition approach described herein can utilize one or more print heads to simply "print" a branch (e.g., the aforementioned "T") into for instance a wet (uncured) conductive trace (see FIG. 3*c*). In one such variant, a single print head is used, and while the first (main) trace is still wet, the head (upon completion of the first trace) returns to the desired branch point and simply begins printing again such that the second "branch" trace contacts or overlaps the first trace, thereby allowing the ink from the two traces to meld and form in effect a common and materially uniform trace when cured. This advantageously obviates any of the aforementioned additional process steps such as soldering, welding, etc., and also mitigates any effects due to the interface of two materials, since the wet first trace and the newly deposited/overlapped wet second or branch trace in effect fuse (due to their liquid properties) to form one substantially homogenous material.

It will further be appreciated that the printing processes between the first and second traces (e.g., main trace and branch trace in this example) may also be varied so as to produce a desired transition with respect to physical or electrical dimensions or properties. For example, in one variant, the ink used for the branch is changed from that used for the main trace, such that the conductive, curing, or other properties are varied to achieve a desired result (e.g., a desired energy reflection point, reduced cost, use of a curing process more amenable to components located near the trace, etc.). In another variant, the ink is maintained consistent between the two traces, yet the physical properties or dimensions of the two traces are varied (e.g., the branch trace has a higher/lower height, larger/smaller width, use of "modulation" of the height and/or width, etc.). Such may be the case for instance where the branch conductive trace must pass under a very low-profile structure, and hence needs to have a lower vertical height. As can be appreciated by those of ordinary skill in the art, it is much more difficult to change a trace height in a prior art LDS or similar process, since inter alia, additional process steps are required for each dimensional change.

Figure 3D:
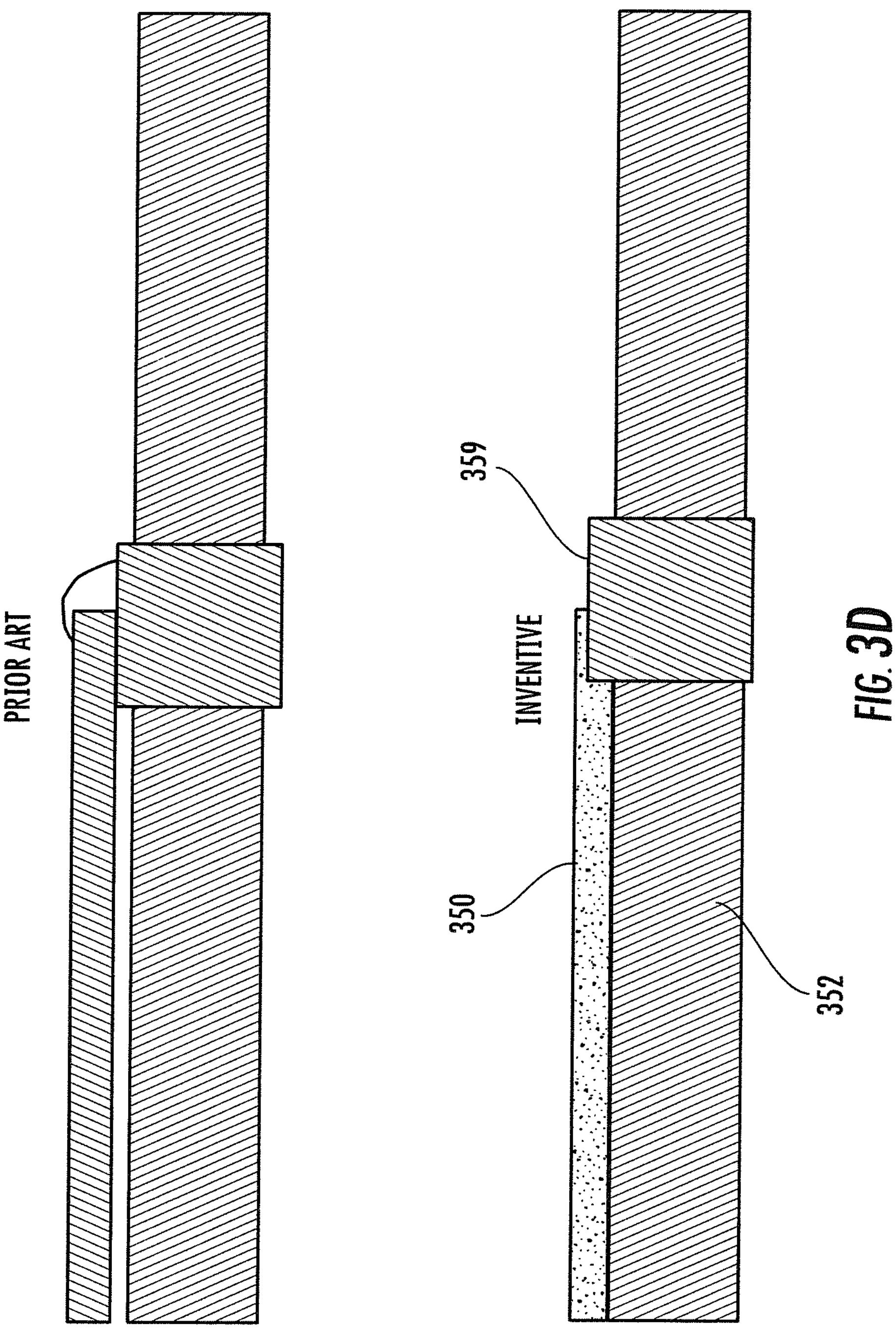
FIG. 3*d* is a cross-sectional view of an exemplary embodiment of the deposition trace of the disclosure, shown forming an antenna feed, and in comparison to a typical prior art feed point technique.

In another aspect of the disclosure, the exemplary deposition processes described herein can be used to make a feed point easily through printing, thereby eliminating process steps/materials/cost. Specifically, prior art feed point technologies typically require bonding (e.g., soldering, brazing, welding, etc.) of the antenna feed conductor to a via, pad or trace 359 on the host device PCB. This approach is necessarily more costly and time consuming than simply printing the antenna right up to (and onto) the desired conductive pad or trace, as in one embodiment of the present disclosure. Hence, the present disclosure obviates one or more process steps, as well as materials such as a separate feed conductor and/or solder paste; see FIG. 3*d*.

Figure 3E:
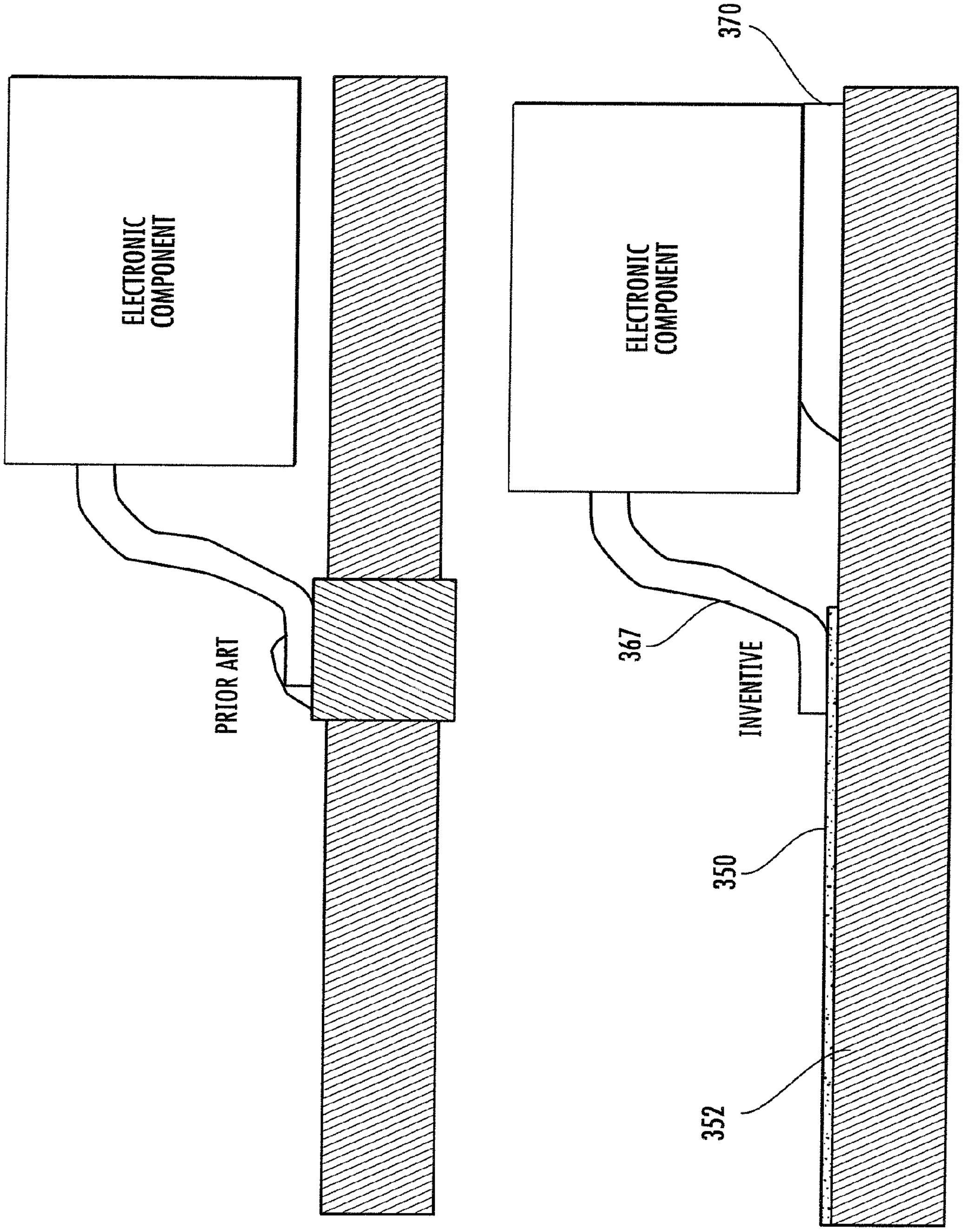
FIG. 3*e* is a cross-sectional view of an exemplary embodiment of the deposition trace of the disclosure, shown for use with mounting an electronic component to a substrate, and in comparison to a prior art surface mounting technique.

Moreover, the exemplary processes described herein can be used to simplify electronic component surface mounting. For instance, in one implementation, a plurality of desired conductive traces 350 are printed or otherwise deposited "wet" onto a substrate; i.e., in a desired contact pattern. A component (e.g., integrated circuit or other surface mount device) is then placed onto the substrate such that its leads 367 (e.g., "gull-wing", solder bumps/BGA, through-hole pins, self-leading terminals (e.g., conductive wires wrapped around molded spools or carriers), etc.) are in contact with the printed wet traces. The placement of the component thereby completes the electrical connections between its leads and the traces without subsequent soldering. The wet traces are then cured so as to make the contact regions permanent. If needed/desired, the electronic component may also be physically bonded to the substrate, such as via the presence or application of a small amount of silicone encapsulant, adhesive, etc. 370 between the component body and the substrate, so as to hence mechanical strength/rigidity, especially during the curing process. See FIG. 3*e*.

Exemplary Mobile Device Configuration

Figure 4:
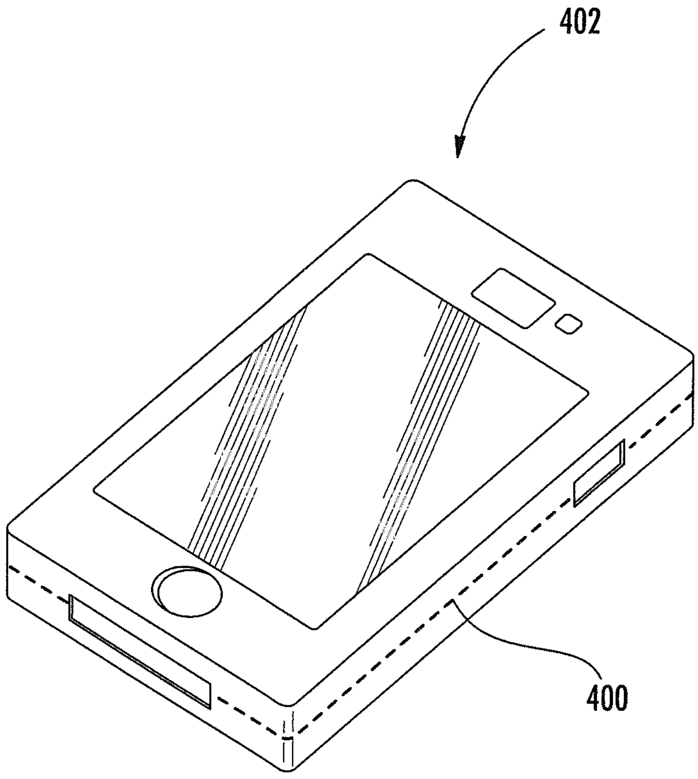
FIG. 4 is a perspective view of one embodiment of a portable radio device, illustrating the placement of an exemplary deposition antenna therein.

Referring now to FIG. 4, one exemplary embodiment of a mobile device comprising the deposition antenna of the present disclosure is illustrated. Specifically, FIG. 4 is a perspective view of one embodiment of a portable radio device (e.g., smartphone) 402, illustrating the placement of an exemplary deposition antenna 400 therein (shown as a dotted line so as to reflect the fact that the antenna "wire" is disposed underneath or within the outer edge surfaces of the device.

As used herein, the terms "mobile device" or "consumer device" or "radio device" may include, but are not limited to, cellular telephones, smartphones, personal computers (PCs) and minicomputers, whether desktop, laptop, or otherwise, as well as mobile devices such as handheld computers, PDAs, personal media devices (PMDs) or any combinations of the foregoing, which utilize one or more antennas for emitting or receiving electromagnetic energy such as radio frequency energy.

Moreover, while exemplary embodiments herein are described primarily in terms of mobile devices, the apparatus and methods of the disclosure are in no way so limited, and may in fact be applied to any radio device which uses an antenna, whether fixed, mobile, semi-mobile, or otherwise.

As is well known, such high-volume consumer devices such as smartphones may comprise any number of different form factors, including for example: (i) a substantially planar device with touch-screen display (FIG. 4); (ii) a "candy bar" type device (see FIG. 3 discussed supra); and (iii) a slide-out or fold-out keyboard device (not shown). The deposition antenna and methods of the present disclosure are particularly well suited to such high-volume consumer devices, since they afford an appreciable manufacturing cost savings (thereby making for reduced device prices), and also support increasingly more aggressive form factors and/or types of materials (e.g., smaller and lighter phones, metal cases, etc.). Moreover, the deposition antenna of the present disclosure affords the manufacturer the ability to readily modify or reprogram the printing or jetting apparatus so as to accommodate changes in the host device hardware (e.g., inclusion of a new component, or movement of an existing one, or added air interfaces such as Bluetooth or Wi-Fi or GPS), as well as changes needed in the antenna configuration itself due to e.g., moving feed point(s), user issues relating to hand placement or interference, adding frequency band requirements, results from development testing (described in greater detail infra) and so forth.

Method of Manufacture

Figure 5:
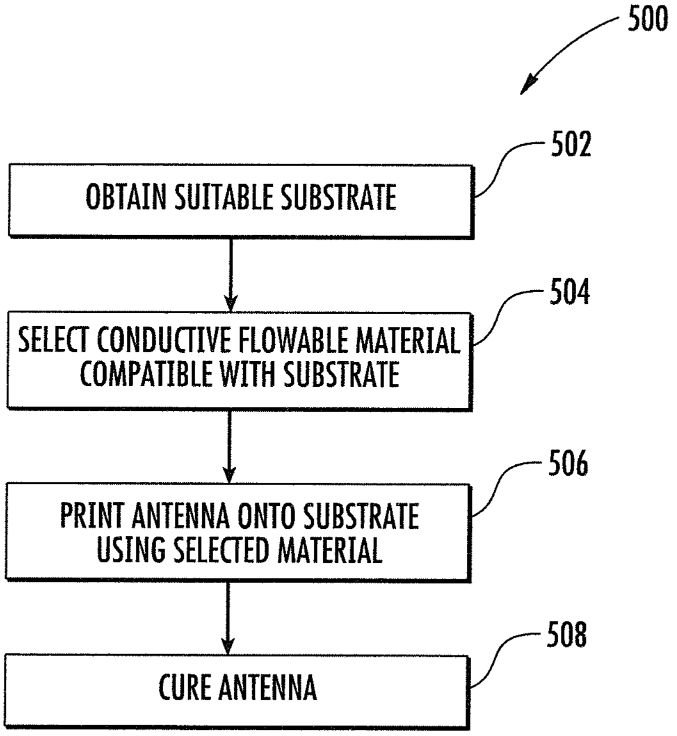
FIG. 5 is a logical flow diagram illustrating one embodiment of a generalized method of manufacturing the deposition antenna of the disclosure.

Referring now to FIG. 5, one embodiment of a generalized method for manufacturing a deposition antenna is shown and described. As illustrated, the first step 502 of the method 500 includes the provision of a suitable substrate for the deposition of the antenna. As previously described, the substrate may take any number of different forms, including without limitation: (i) a substantially flat or planar form, (ii) a curved (e.g., concave) surface; (iii) a planar or curved surface having one or more surface features or details; or (iv) multiple connected or disjointed ones of the foregoing. It may be fabricated as a separate component, or alternatively as part of a larger component or device.

At step 504, the appropriate conductive flowable material is selected for the provided substrate. As noted previously herein, the present disclosure contemplates that certain conductive materials or formulations may be better suited to different materials or types of substrates, and vice versa.

Next, per step 506, the selected material is deposited onto the substrate in a desired pattern (e.g., 2-D or 3-D "wire loop" as previously discussed herein).

Finally, per step 508, the deposited material is cured, such as via an electromagnetic radiation (e.g., laser) "flash" cure process or exposure.

Figure 5A:
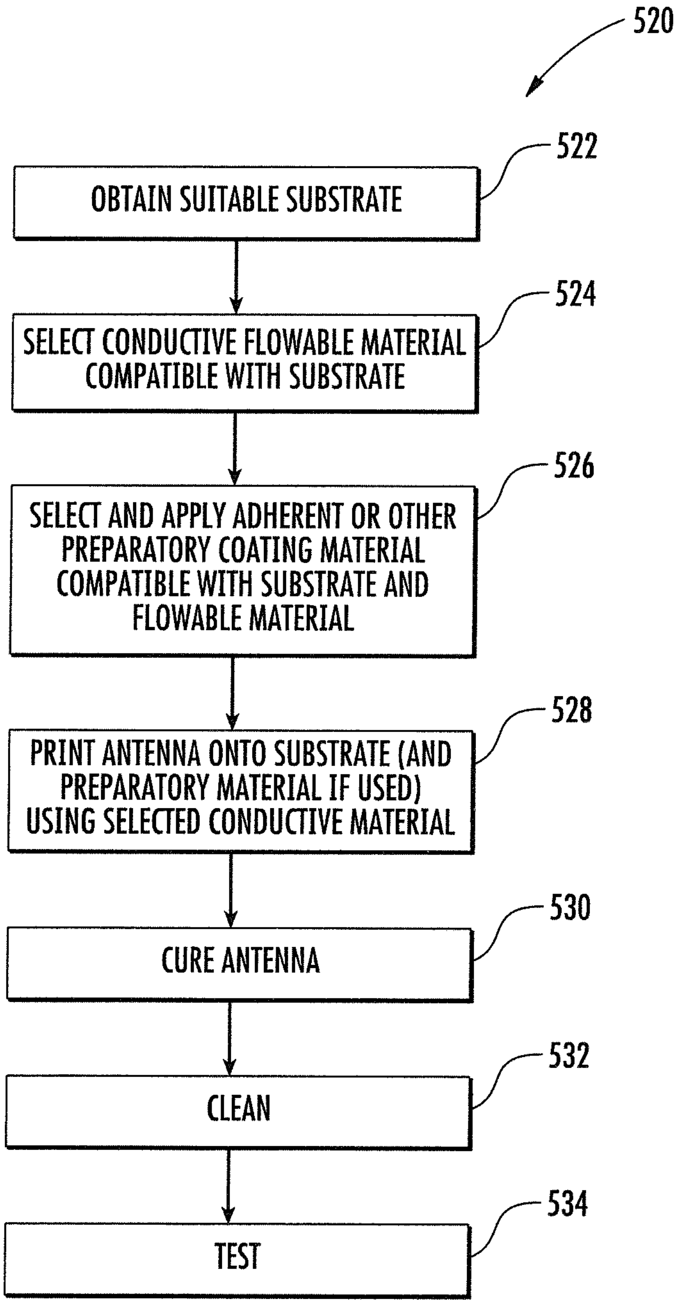
FIG. 5*a* is a logical flow diagram illustrating one exemplary implementation of the generalized method of FIG. 4.

Referring now to FIG. 5*a*, one exemplary implementation of the generalized method for manufacturing a deposition antenna of FIG. 5 is shown and described.

As illustrated, the first step 522 of the method 520 includes the provision of a suitable substrate for the deposition of the antenna.

At step 524, the appropriate conductive flowable material is selected for the provided substrate. As noted above, the disclosure contemplates that certain conductive materials or formulations may be better suited to different materials or types of substrates, and vice versa; this concept also extends to selection of any adherents, preparatory components or similar materials (or preparatory processes such as heating, laser exposure, chemical washes, etc.) if used (step 526), such that the substrate material, conductive fluid material, and the (surface) preparatory material are selected so as to be compatible and provide the desired level of adhesion (or other mechanical property of interest) for the conductive fluid, both before and after curing.

As a brief aside, the exemplary adhesion property discussed above relates generally to adhesion of the printed or flowable conductive material to the plastic during the useful life of the antenna. In the printing sciences, another salient consideration relates to getting the flowable medium (e.g., ink fluid) to wet out in a certain fashion, so that the printed image (or trace) has the proper geometry. This wetting is impacted by, inter alia, the surface and fluid energy/tension. Common problems include the fluid pooling or the fluid beading up. Advantageously, the exemplary antenna traces described herein are less concerned (and hence less susceptible) to such effects, in that the localized geometry of the antenna is less critical. Stated differently, a printed antenna that has minor variations or geometry "flaws" here and there will generally perform identically with one that is in effect perfect, thereby relaxing the level of printing accuracy required.

Next, per step 528, the selected material is deposited onto the substrate (and any material used in step 526) in a desired pattern (e.g., 2-D or 3-D "wire loop" as previously discussed herein). In the exemplary embodiment, this step includes loading the selected material into a pneumatic or piezoelectric or other print head reservoir, and programming the print apparatus to print the desired pattern. The print head provides both accurate placement of fluids (e.g., the conductive fluid or ink described herein), very high efficiency and repeatability, and very low capital investment cost, while the devices driving such heads also offer great flexibility and reprogrammability.

As part of this step, the thickness (height), width, density, or other property of the deposited conductive fluid may also be varied as a function of position on the loop so as to effect the desired configuration, including a three-dimensional topography (i.e., where the thickness/geometry of the wire loop stays effectively constant, but the surface on which it is printed varies in multiple dimensions) and/or features (i.e., where the topography is constant, such as a flat substrate, but features of varying proportions are desired).

Per step 530, the deposited material is cured, such as via an electromagnetic radiation (e.g., laser) "flash" cure process or exposure. In one variant, a laser of the appropriate wavelength and energy is used to trace the deposited antenna wire and cure it as it proceeds, such as via short bursts of laser energy so as to deposit a desired level of energy within the conductive ink, and cause the requisite curing chemical reaction(s) therein.

Alternatively heat, electricity (e.g., electrical current), chemical agents or substances, or even microwave energy may be used to cure the deposited material.

It will also be appreciated that the flowable conductive material may be reformulated to achieve very specific desired properties, such as very rapid curing. Pre-treatments or preparatory coatings can be useful to increase adherence and conductive fluid receptability. This allows a range of substrates to be used without changing the conductive flowable material.

Lastly, the cured assembly is cleaned (e.g., such as by dipping in an appropriate solvent) per step 532, and the antenna tested (step 534).

Development

Figure 6:
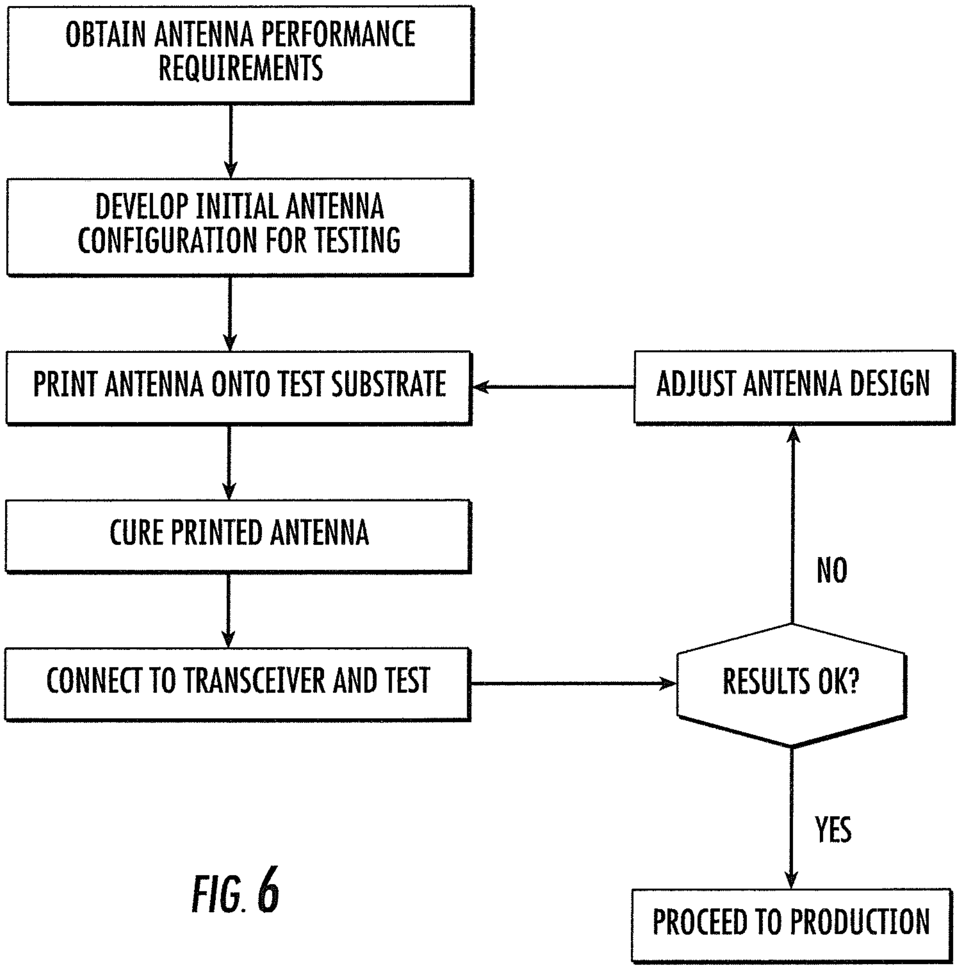
FIG. 6 is a logical flow diagram illustrating one embodiment of a generalized method of development testing of the deposition antenna of the disclosure.

FIG. 6 is a logical flow diagram illustrating one embodiment of a generalized method of development testing of the deposition antenna according to the disclosure. As can be appreciated by those of ordinary skill in the antenna arts, significant trial-and-error in terms of physical implementations of an antenna is often required, due in part to factors such as imperfections in materials, imperfections in computerized antenna modeling software, and unknown or unanticipated effects from components present in the production device (e.g., metallic components such as frames, buttons, wires, etc.). Stated simply, the assembled device may not operate exactly as anticipated by modeling, or even as expected based on earlier tests performed when the device was not assembled.

Moreover, even after the device has been assembled, effects of other factors such as the placement of the user's hand, proximity to the user's head, etc. may impact the efficacy or operation of the antenna.

Hence, in another aspect, the present disclosure advantageously facilitates rapid prototyping, tuning and testing of various antenna configurations to a level which is generally unachievable with prior art technologies, including LDS. Specifically, the present disclosure allows in one exemplary approach the ability to rapidly reprogram the printing or jetting apparatus such that different antenna patterns, shapes, widths, thicknesses, materials, etc. are used, so as to e.g., see the effects thereof on antenna performance, or perform sensitivity analysis for the various parameters. Hence, in one example development regime, a plurality of substrates (e.g., cell phone rear housings such as that of FIG. 3) are printed with deposition antennas of varying configurations and cured. Each of the different antennas are tested by simply connecting the housing/antenna to the phone (mechanically and electrically), and performing the necessary tests. Changes to the configuration of each antenna (so as to tune it properly for the desired band) may include e.g., moving portions of the antenna to different locations, such as by moving angled bends or turns within the antenna forward or backward within the "loop", and then retesting.

This "rapid prototyping" obviates the prior art need of having to build mockups or hand-make prototypes for testing (necessitated by a lack of production facilities for the new antenna); rather, under the inventive paradigm disclosed herein, the development engineer can rapidly just "print up" a set of different antennas on identical substrates (e.g., cell phone housings), and test them immediately.

Likewise, very short production runs can be used to test the viability of a given design, such as by producing a small number of handsets with a given design, and distribute them for in-the-field testing by users before a complete production run is instituted. Such "short runs" also allow for minor adjustments to the antenna geometry across the same type of device; e.g., those destined for distribution in a given country having particular operational considerations may have a slightly different variant of the antenna used in devices destined for other countries; the slight variation is readily accommodated using the present disclosure without having to undergo significant manufacturing process changes.

PCB Variants

Figure 8:
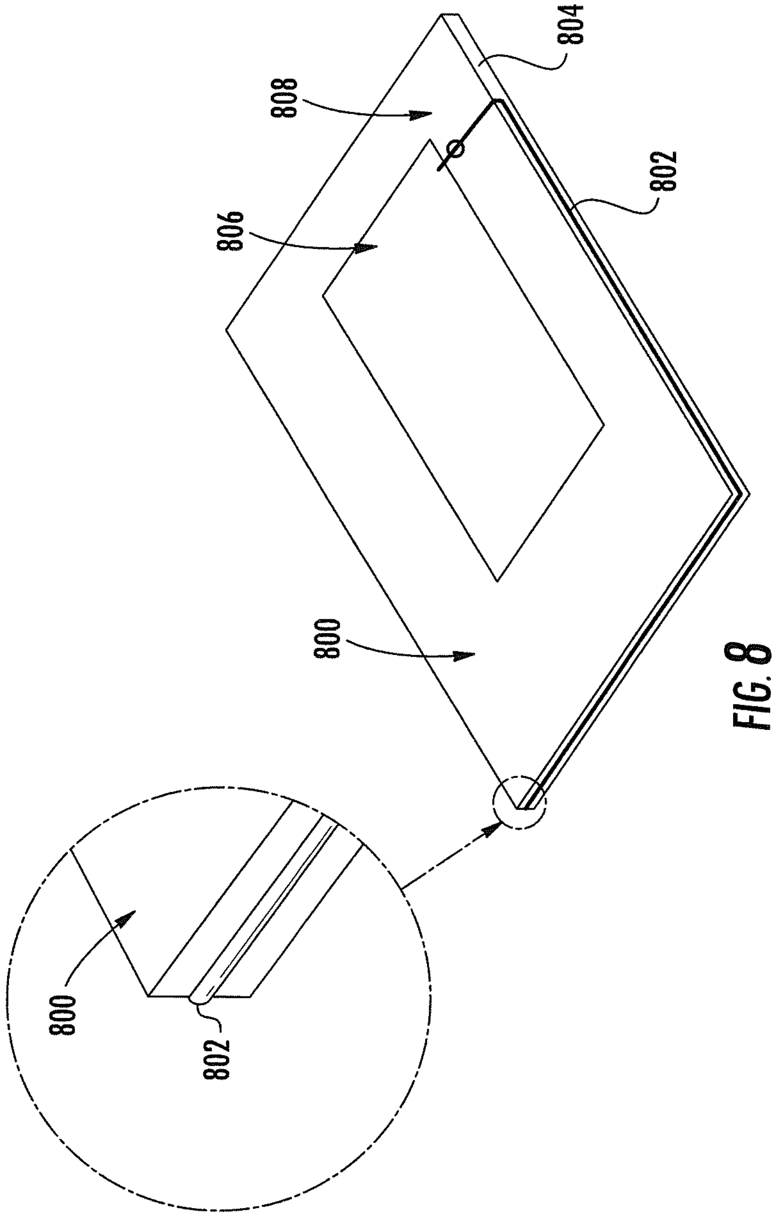
FIG. 8 is a perspective view of an exemplary substrate-edge trace embodiment, such as where a Bluetooth or Wi-Fi antenna element is formed on the edge of a smartphone printed circuit board (PCB).

In another aspect of the disclosure, an antenna can be disposed wholly or partly on (and/or proximate to) the edge of the host device PCB or other such internal component suitable to receive it, such as is shown in FIG. 8 herein. Such approach can advantageously be used for formation of any number of different antenna types, including without limitation Bluetooth and Wi-Fi (IEEE Std. 802.11) antennas, as well as cellular (e.g., 3GPP or LTE) or WMAN types.

Placement of the deposition antenna 802 on the edge 804 of the PCB 800 saves space and cost (such as for radio/transceiver components 806, and the feed 808), because such approach does not require additional components (e.g., dedicated support or other components for the antenna), and as described in greater detail below, the steps necessary to cure the antenna can be performed if desired as part of other PCB processing steps.

Presently, there are ways that an antenna can be disposed on the PCB of an electronic device (such as e.g., a smartphone) using the same PCB processes as the rest of the electrical circuit (e.g., involving etching), but such approaches require a fair amount of PCB space (i.e., on one face or the other of the PCB, and so as to displace other possible uses of the consumed space, such as for circuit traces or surface mounted components), and with the result that the accuracy of the antenna is difficult to make consistent because of the PCB process (e.g., such processes may also be sensitive to the PCB's material properties and thickness variations, which can adversely affect production yield). Traditionally, there is very long process chain from antenna testing to PCB masking using such prior art approaches as well.

Moreover, trying to tune a given antenna design for the "batch" characteristics of the PCB materials and fabrication processes is virtually impossible, since such batch variations inherently affect antenna tuning/electrical performance. Hence, where a given parameter associated with an antenna (e.g., a certain dimension such as trace width in a given region) is statistically distributed according to e.g., a Gaussian or "bell" curve, particular specimens at either end of the distribution may have significant variations in trace width and hence electrical performance, thereby almost necessarily requiring different tuning. In that the process cannot be more tightly controlled, such variations are very difficult to eliminate.

Depending on the desired application and attributes, two options are generally available under the exemplary PCB deposition approach of the present disclosure: (i) deposit the antenna on the PCB prior to soldering (e.g., after the component pick and place process but prior to soldering)—the subsequent soldering heat may be used to cure the deposited antenna; or (ii) deposit the antenna after the PCB processing and cure separately (such as via applied heat or radiation). The higher solder process heat advantageously provides better performance, but conversely the later deposition (i.e., after PCB processing) approach enables more rapid/better feedback and controlling of the deposition process.

Further benefits of either of the foregoing approaches include much shorter process/time from antenna printing to testing of the antenna/PCB, and facilitating feedback/tuning and "versioning" (i.e., deposition, curing, and testing cycles) as well.

Moreover, prototyping is facilitated through use of the various aspects of the present disclosure. For example, in one implementation, a number of substantially identical PCBs that have been processed and are ready for use in a host device are first obtained. Several "trial" antenna configurations are developed (such as by computer simulation or other techniques), and then deposited on respective ones of the PCBs (varied with respect to, e.g., shape, placement, fluid material used curing process, etc.) using e.g., the deposition printing processes(s) described previously herein. The deposited antennas are then tested and evaluated, until the desired electrical and/or physical (e.g., process, mechanical, etc.) properties are identified and achieved for that given PCB configuration. This latter process may involve iteration as well; e.g., identification of a change in the configuration, and adjusting the deposition process to implement the change. Once the antenna (and process) configuration for that particular PCB type is determined, the antenna can then be deposited and cured in a mass-production process using one of the foregoing methods as appropriate, such as through deposition before soldering, and curing during the soldering process.

It will also be appreciated that the foregoing prototyping and versioning processes may be conducted in certain cases without curing the deposited antennas if desired; i.e., "wet". For example, where it is determined that the curing process has little or no effect on electrical properties of the antenna (but rather only significantly affect the physical/mechanical properties, such as resistance to undesired flow or distortion of the antenna loop trace or hardness), the curing step or process may be obviated so as to further economize the prototyping/versioning process. The foregoing is true whether the deposition antenna is applied to a PCB or any other substrate.

It is further appreciated that while the feed point 808 of the embodiment of FIG. 8 is shown disposed on a face of the PCB, the feed itself may also be disposed on the edge 804, and "printed to" as described elsewhere herein to form the electrical connection, thereby obviating a separate process step (and any associated tools/materials required by that step).

Performance

Referring now to FIGS. 7*a*-7*d*, performance results obtained during testing by the Assignee hereof of exemplary antenna apparatus constructed according to the disclosure are presented.

Figure 7A:
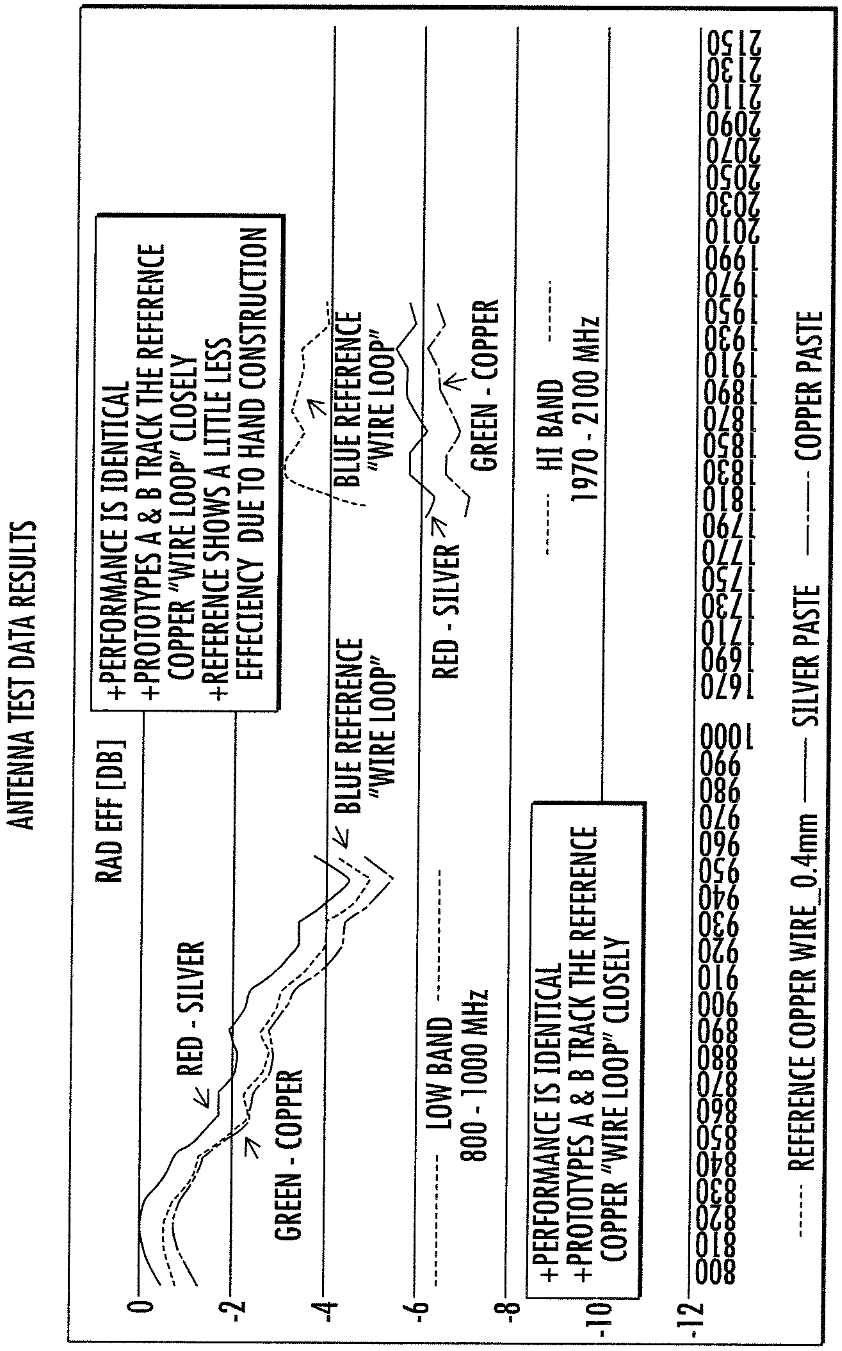
FIGS. 7*a*-7*d* illustrate exemplary performance data obtained by the Assignee hereof in prototype testing of various aspects of the disclosure.

Referring now to FIG. 7*a*, a plot of effective radiation (in dB) is shown, comparing: (i) a reference 0.4 mm diameter wire antenna; (ii) a Cu (flowable) paste printed antenna; and (iii) an Ag (flowable) paste printed antenna. Each of the foregoing (ii) and (iii) were deposited on an FR4 substrate that was also used for the reference antenna (i).

As indicated in FIG. 7*a*, the performance of each of the "printed" antennas is highly similar to the wire reference antenna below about 1100 MHz. Above about 1970 MHz, the three antennas again show similar performance.

Figure 7B:
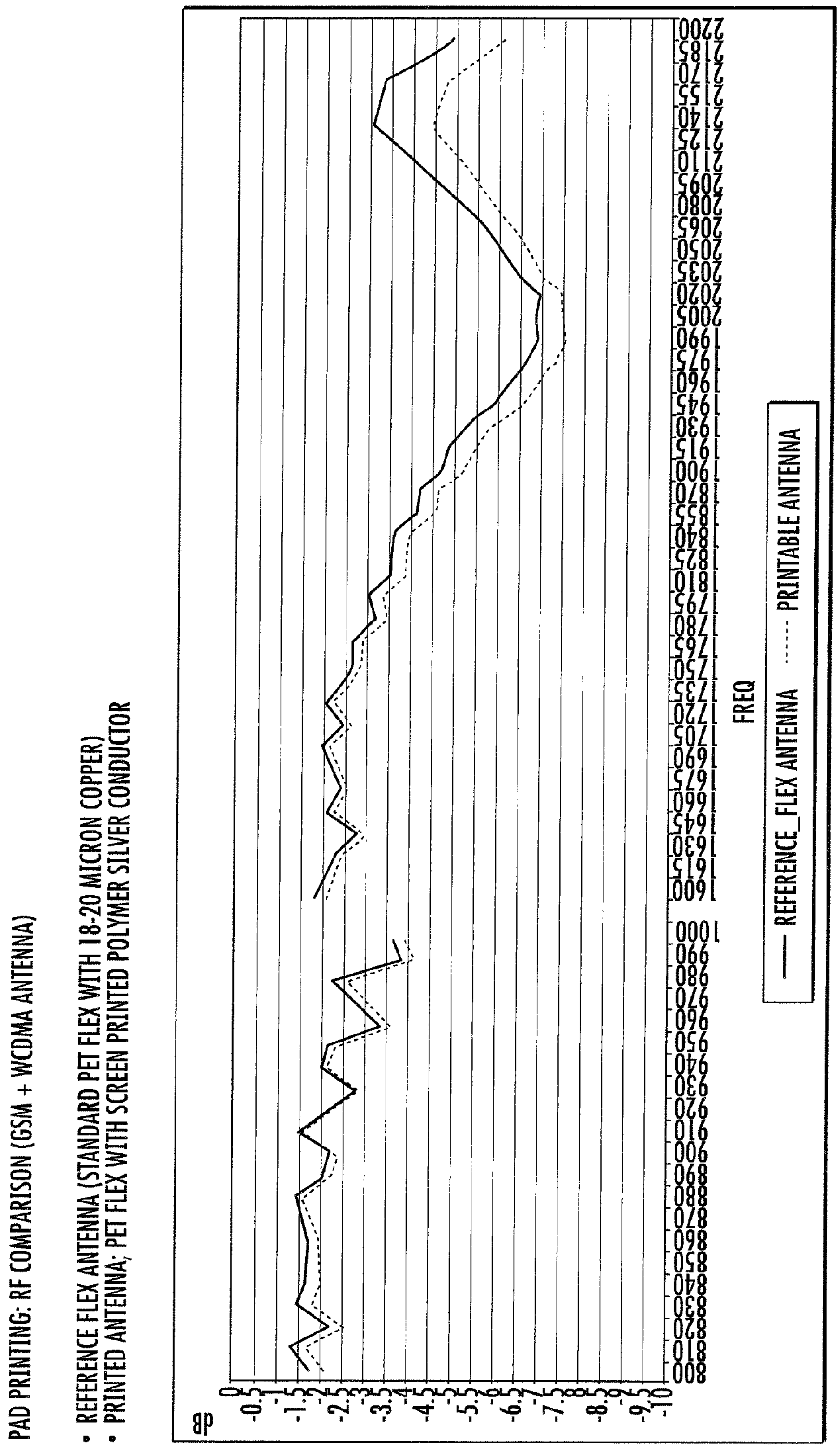

FIG. 7*b* illustrates an exemplary pad printing comparison for a GSM+WCDMA antenna. In this illustration, the reference antenna is a flex antenna (standard PET flex with 18-20 micron copper), while the printed antenna is a PET flex with screen printed polymer silver conductor. Again, the performance of the reference and printed antennas is highly similar.

Figure 7C:
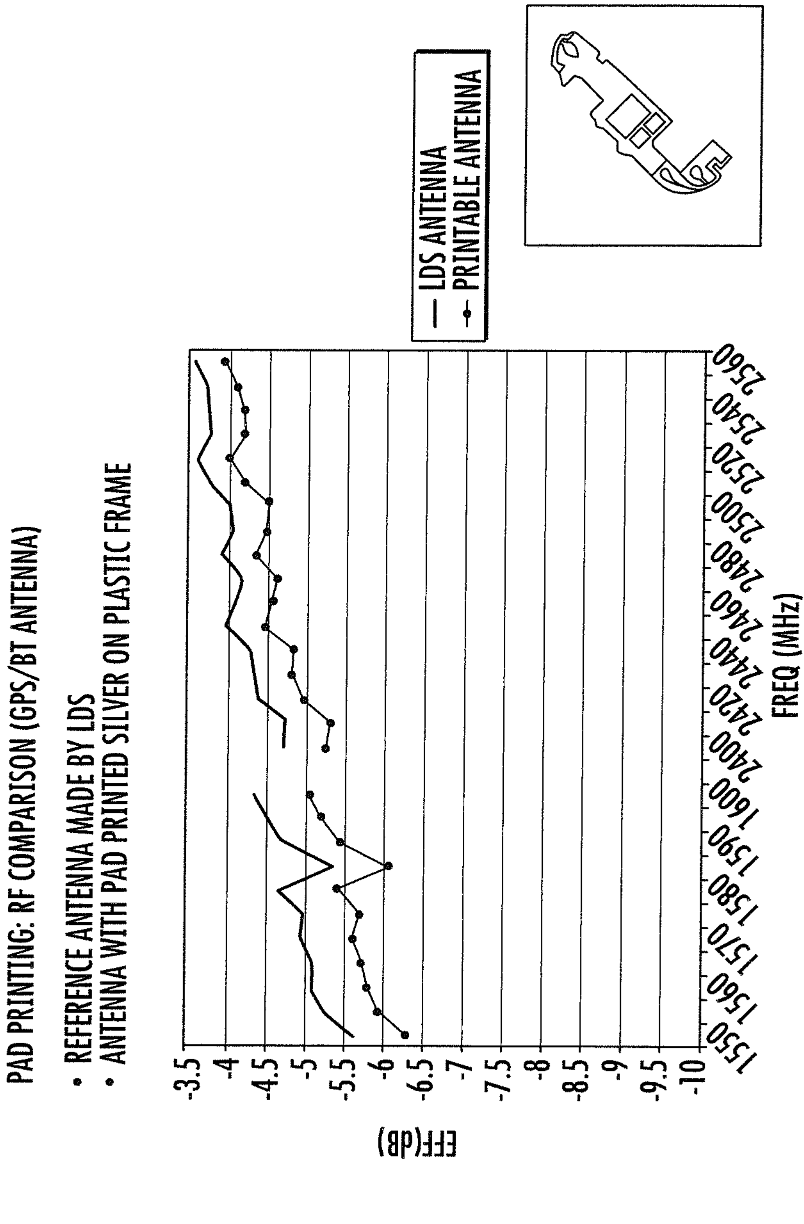

FIG. 7*c* illustrates an exemplary pad printing comparison for a GPS/Bluetooth antenna. In this illustration, the reference antenna is made by using a prior art LDS process, while the printed antenna comprises printed silver on a plastic frame. Once again, the performance of the reference and printed antennas is highly similar.

Figure 7D:
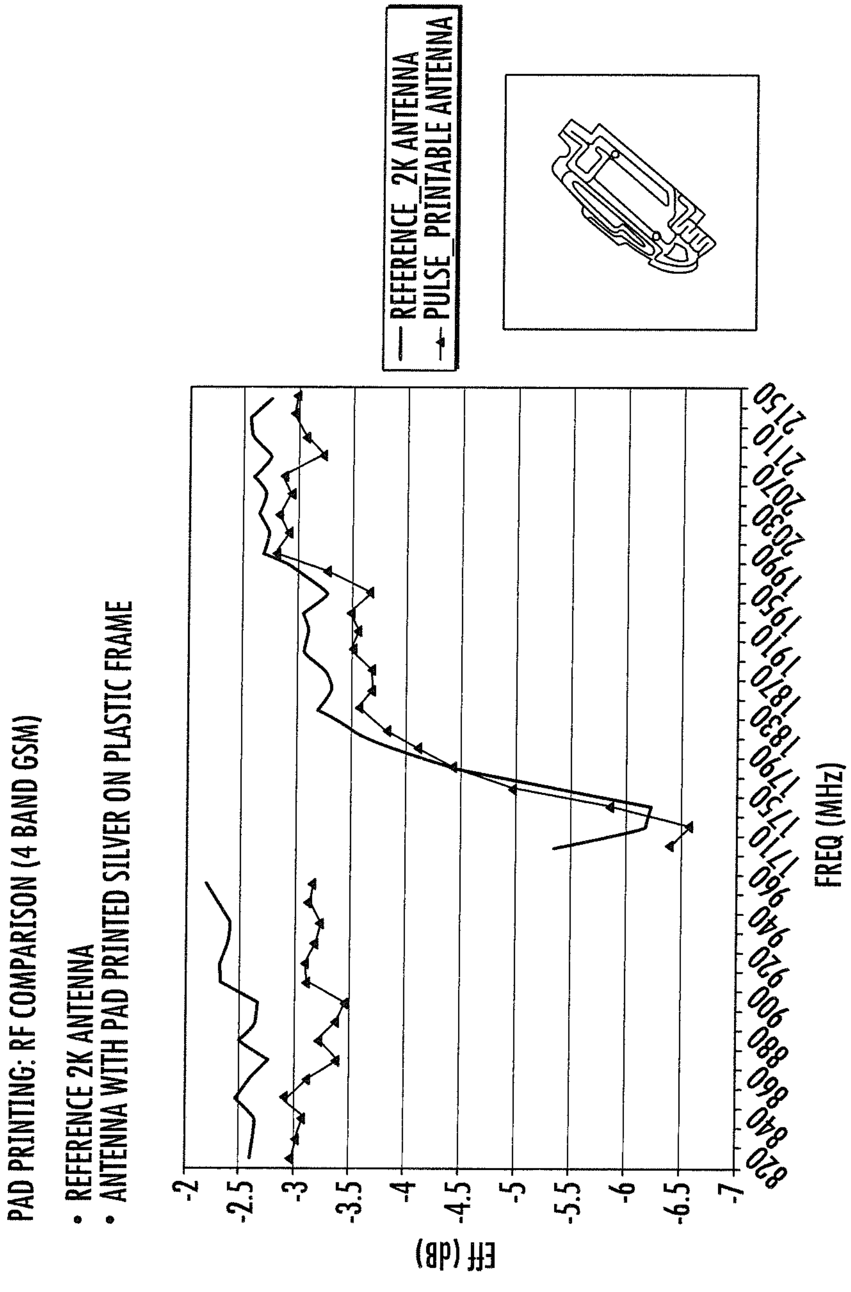

FIG. 7*d* illustrates an exemplary pad printing comparison for a 4-band GSM antenna. In this illustration, the reference antenna is a "2K" antenna of the type known in the art, while the printed antenna comprises printed silver on a plastic frame. Once again, the performance of the reference and printed antennas is highly similar.

Manufacturing Apparatus

In one embodiment, an off-the-shelf ink jet printing system (such as those ubiquitous on the commercial market) having a print head and fluid cartridge is utilized to provide the fluid deposition. In one variant, the factory cartridge is essentially refilled with the selected conductive fluid, and the printer programmed to print the desired pattern. This approach is suited to largely two-dimensional patterns, as well as three-dimensional patterns. In the latter case, one exemplary configuration utilizes a first print head that prints from the downward position, and a second print head that prints from either side, although it will be appreciated that other configurations (e.g., a single articulated print head, or multi-dimensional heads) may be used consistent with the present disclosure.

In another embodiment, a more sophisticated arrangement configured to permit more intricate patterns (including in three dimensions) is utilized, comprising a pneumatic or piezoelectric print head (see Exhibit A hereto which details, inter alia, exemplary print head settings) and conductive fluid reservoir supplying the head. A multi-dimensional jig or other apparatus configured to move the target substrate (e.g., cell phone housing interior surface) in three dimensions is also employed, so that the print head moves at a desired distance from the surface of the substrate as the fluid is deposited. Angular control (i.e., control of the angle of the head to the target surface) is also optionally controlled so as to maintain the deposition process within desired parameters such as conductive trace width. Moreover, the speed of movement is adjustable so as to obtain the desired deposition rate (i.e., volume of conductive fluid per linear distance of the loop).

The apparatus described above may also be computer-driven, such as where a computer (e.g., PC, server, etc.) or other computerized controller is used to control the operation of the print head(s). In one exemplary implementation of the disclosure, extant computer algorithms used in conjunction with the foregoing apparatus are modified so as to provide the desired level/attributes of printer performance; e.g., to adjust print head speed, angle, ink flow, and/or delay, as applicable. Herein lies another salient advantage of the techniques of the present disclosure; i.e., they are in many cases amenable to implementation using existing print technology that has merely been algorithmically modified, thereby obviating a complete "ground up" system design (or re-design). Such algorithmic manipulation further carries the associated advantage or rapid prototyping/reconfiguration; one can literally adjust the relevant programs/algorithms on their computerized device, reload the program, and immediately adjust the printing process. It can be appreciated that, depending on the application (i.e., substrate material(s), types of ink, physical dimensions/geometries, required curing process, etc.), significant "trial and error" may be required to optimize the resulting trace/antenna product. Such algorithmic manipulation readily allows for such adjustments without further investment in hardware or specialized equipment. Where a different or new print head must be used, the software associated with that head can also be readily loaded and used.

As previously noted, the comparatively simple process technology and manufacturing apparatus of present disclosure also permit the displacement (if desired) of manufacturing operations from a dedicated manufacturing facility to an existing component manufacturing facility. Specifically, the antenna manufacturing process can be readily integrated into the manufacture of the housing of a portable device in which the antenna will be used. This reduces antenna (and device) manufacturing cost and overhead, in that separate facilities, personnel, shipping, etc. are obviated, as is the latency in providing such components to a third party host device manufacturer under typical prior art approaches. This is especially due to the fact that the manufacturing process of the present disclosure effectively requires no hazardous chemicals or other materials (e.g., those of the prior art plating process), and hence can be performed literally anywhere.

Moreover, under this "combined" manufacturing paradigm, individual component manufacturers can readily make adjustments to the antenna configuration or process on-site, without having to employ qualification or other manufacturing testing procedures for their vendors or suppliers as in the prior art. Rather, the component manufacturer or integrator can control the manufacturing process directly.

It will be recognized that while certain aspects of the disclosure are described in terms of a specific sequence of steps of a method, these descriptions are only illustrative of the broader methods of the disclosure, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered to be encompassed within the disclosure and claims herein.

While the above detailed description has shown, described, and pointed out novel features of the disclosure as applied to various embodiments, it will be understood that various omissions, substitutions, and changes in the form and details of the device or process illustrated may be made by those skilled in the art. The foregoing description is of the best mode presently contemplated. This description is in no way meant to be limiting, but rather should be taken as illustrative of the general principles of the disclosure.

What is claimed is:

1. An electronic component for use in a host device, comprising:

a substrate comprising a plurality of circuits and electronic components disposed thereon, the substrate having at least one edge; and a loop-like antenna disposed on at least a portion of the at least one edge, the antenna configured to perform at least one of transmission and/or reception of a wireless signal in one or more prescribed frequency bands;

wherein the antenna has been disposed prior to a soldering process associated with the substrate, and curing of the antenna is performed substantially simultaneous with the soldering process.

2. The component of claim 1, wherein the antenna has been disposed using a fluidic printing process and subsequently cured.

3. The component of claim 1, wherein the curing of the printed antenna performed substantially simultaneous with the soldering process comprises use of the soldering process to provide the curing.

4. Antenna apparatus, comprising:

a conductor deposited on a component of a portable device, at least a portion of the conductor forming a radiator for the antenna apparatus, wherein the conductor is formed using the process comprising:

depositing a conductive flowable substance onto the component in a desired pattern;

placing one or more electronic components onto at least a portion of the deposited conductive flowable substance; and curing the deposited flowable substance so as to render the flowable substance substantially non-flowable;

wherein the curing of the deposited flowable substance secures the one or more electronic components to the component of the portable device.

5. The antenna apparatus of claim 4, wherein the conductor comprises a wire-like form factor substantially enclosing a central region having no conductive substance therein.

6. The antenna apparatus of claim 4, wherein the curing comprises using at least one of electromagnetic radiation or heat, and the depositing comprises depositing using an electrically controlled print head.

7. The antenna apparatus of claim 4, wherein the conductor comprises a wire-like form factor substantially enclosing a central region, the component comprising a plurality of electrical components disposed substantially within the central region.

8. A method of manufacturing an antenna apparatus, comprising:

depositing a conductive fluid in a desired form, where at least a portion of the deposited conductive fluid comprises an antenna radiator;

placing one or more electronic components onto at least a portion of the deposited conductive fluid; and subsequently curing the deposited fluid using thermal energy;

wherein the curing of the deposited fluid secures the one or more electronic components simultaneous with the curing of the antenna radiator.

9. The method of claim 8, wherein the method utilizes no plating steps or processes.

10. The method of claim 9, wherein the depositing comprises depositing on an extant interior surface or component of a mobile wireless device, and the method utilizes no additional preparation of the surface.

11. The method of claim 8, wherein the depositing comprises depositing on two or more extant interior surfaces or components of a mobile wireless device that are substantially adjacent to one another.

12. The method of claim 8, wherein the form comprises a three-dimensional form such that a trace formed by the deposited fluid includes one or more changes in direction.

13. Antenna apparatus, comprising a structure formed by deposition of a conductive flowable material onto a substrate comprising one or more circuits and one or more electronic components disposed thereon, the conductive flowable material having at least one variation in at least one of a (i) cross-sectional shape and/or (ii) a cross-sectional area;

wherein the antenna apparatus has been disposed prior to a soldering process associated with the substrate, and curing of the antenna apparatus is performed substantially simultaneous with the soldering process.

14. The apparatus of claim 13, wherein the structure comprises a substantially wire-like form factor, and the variation in at least one of a (i) cross-sectional shape and/or (ii) a cross-sectional area comprises variation in both of (i) cross-sectional shape and (ii) cross-sectional area.

15. The apparatus of claim 14, wherein the flowable material has been rendered substantially non-flowable at least by application of at least one of heat and/or electromagnetic radiation.

16. The apparatus of claim 15, wherein the variation in both of (i) cross-sectional shape and (ii) cross-sectional area effects a change in electromagnetic radiation or reception performance for the antenna from a first portion having a first cross-sectional shape and first cross-sectional area to a second portion having a second cross-sectional shape and second cross-sectional area.

17. The apparatus of claim 16, wherein the change in electromagnetic radiation or reception performance for the antenna comprises an ability to operate in two or more different frequency bands.

18. Manufacturing apparatus useful for manufacturing of deposition antennas, the apparatus comprising:

a print head configured to emit a quantity of a flowable conductive substance for deposition onto a substrate, the substrate configured to have one or more circuits and one or more electronic components disposed thereon;

motion apparatus configured to move the substrate relative to the print head or move the print head relative to the substrate, so as to permit deposition of the conductive substance onto different portions of the substrate; and heat or electromagnetic radiation curing apparatus;

wherein the motion apparatus is further configured to move the print head or target component in three dimensions so as to effect deposition of the conductive substance on a three -dimension portion of the substrate; and wherein the flowable conductive substance has been disposed prior to a soldering process associated with the substrate, and curing of the antenna apparatus using the heat or electromagnetic radiation curing apparatus is performed substantially simultaneous with the soldering process.

19. A method of forming an antenna having first and second portions having first and second geometries, respectively, the method comprising:

obtaining a substrate configured to have one or more circuits and one or more electronic components disposed thereon;

depositing a first flowable conductive fluid onto the substrate in the first portion in the first geometry; and depositing a second flowable conductive fluid onto the substrate in the second portion in the second geometry, the acts of depositing causing formation of an electrically conductive pathway from the first portion to the second portion;

wherein the antenna has been deposited prior to a soldering process associated with the substrate, and curing of the antenna is performed substantially simultaneous with the soldering process.

20. The method of claim 19, wherein the first flowable conductive fluid comprises a different fluid than the second fluid.

21. The method of claim 19, wherein the first geometry comprises a different cross-sectional profile than that of the second geometry.

22. The method of claim 19, further comprising curing the first portion and the second portion simultaneously using at least one of heat or electromagnetic radiation.

23. The method of claim 19, wherein the first and second conductive fluids comprise the same fluid, and the depositing a flowable conductive fluid in the first portion and the depositing a flowable conductive fluid in the second portion comprise depositing using a common print head and in one substantially continuous expulsion of the conductive fluid by the print head.

* * * * *